United States Patent
Previsic et al.

(10) Patent No.: US 12,130,138 B2
(45) Date of Patent: Oct. 29, 2024

(54) SYSTEM AND METHOD FOR WAVE PREDICTION

(71) Applicant: Re Vision Consulting, LLC, Sacramento, CA (US)

(72) Inventors: Mirko Previsic, Sacramento, CA (US); Ravi Challa, Sacramento, CA (US); Anantha Karthikeyan, Sacramento, CA (US)

(73) Assignee: RE VISION CONSULTING, LLC, Sacramento, CA (US)

( * ) Notice: Subject to any disclaimer, the term of this patent is extended or adjusted under 35 U.S.C. 154(b) by 0 days.

(21) Appl. No.: 18/389,524

(22) Filed: Nov. 14, 2023

(65) Prior Publication Data
US 2024/0093989 A1 Mar. 21, 2024

Related U.S. Application Data

(63) Continuation of application No. 17/435,684, filed as application No. PCT/US2020/020703 on Mar. 2, 2020.

(60) Provisional application No. 62/812,838, filed on Mar. 1, 2019.

(51) Int. Cl.
| | |
|---|---|
| *G01C 13/00* | (2006.01) |
| *G05D 1/00* | (2006.01) |
| *G05D 1/02* | (2020.01) |
| *G06F 30/28* | (2020.01) |

(52) U.S. Cl.
CPC ......... *G01C 13/002* (2013.01); *G05D 1/0206* (2013.01); *G06F 30/28* (2020.01)

(58) Field of Classification Search
CPC ....... G01C 13/00; G01C 13/002; G06F 30/00; G06F 30/28; G05D 1/02; G05D 1/0206
USPC .......................................................... 703/2
See application file for complete search history.

(56) References Cited

U.S. PATENT DOCUMENTS

| | | | |
|---|---|---|---|
| 8,000,945 B2 * | 8/2011 | Rogers | G06F 30/20 703/2 |
| 8,494,697 B2 * | 7/2013 | Ballou | G05D 1/0875 701/21 |
| 10,395,114 B1 * | 8/2019 | Freeston | G06N 20/00 |
| 10,677,891 B2 * | 6/2020 | Rudzinsky | G01S 13/605 |
| 10,780,968 B2 * | 9/2020 | Kusters, Jr. | G01S 7/04 |
| 11,034,418 B2 * | 6/2021 | Lee | G01B 11/18 |
| 2010/0246322 A1 | 9/2010 | Welker | |
| 2012/0130569 A1 | 5/2012 | Huntsberger et al. | |
| 2013/0124526 A1 | 5/2013 | Birdwell et al. | |
| 2015/0025804 A1 | 1/2015 | Jones et al. | |

(Continued)

OTHER PUBLICATIONS

Halliday, J. Ross, et al., An application of the Fast Fourier Transform to the short-term prediction of sea wave behaviour, Renewable Energy, Jun. 1, 2011, pp. 1685-1692, vol. 36, No. 6.

(Continued)

*Primary Examiner* — Lars A Olson
(74) *Attorney, Agent, or Firm* — Eleanor Musick; Torrey Pines Law Group PC

(57) ABSTRACT

A method and system for prediction of wave properties include collecting time-series data streams from one or more wave measurement devices and processing the data to identify data parameters to establish boundary conditions of a numerical model. The numerical model may be used to compute a predicted wave field of time-series data for a variety of wave properties at a target location.

24 Claims, 12 Drawing Sheets

(56) References Cited

U.S. PATENT DOCUMENTS

2016/0334527 A1 11/2016 Xu et al.
2018/0275313 A1 9/2018 Pierik et al.

OTHER PUBLICATIONS

Zhao, et al., Applied Ocean Research, "Numberical and experimental study on a 2-D floating body under extreme wave conditions."; Jan. 3, 2012.
Zivot, E., et al., Rolling Analysis of Time Series, SpringerLink, Dec. 31, 2006, pp. 1-5, retrieved from the Internet: URL:https://link.springer.com/chapter/10.1 007/978-0-387-32348-0_9.
PCT/US2020/020703, International Search Report and Written Opinion, Jun. 4, 2020, 10 pp.
Cavaglieri, D., et al., Model Predictive Control Leveraging Ensemble Kalman Forecasting for Optimal Power Take-Off In Wave Energy Conversion Systems, 2015 American Control Conference, Jul. 1-3, 2015, pp. 5224-5230.
Desouky, Mohammed A. A. et al., Research Gate, Wave Prediction using Wave Rider Position Measurements and NARX Network in Wave Energy Conversion, Nov. 2018, 37 pages.
EP Application No. 20 76 5806.3 Extended European Search Report and Written Opinion, Nov. 23, 2022, 10 pages.
Chen, J., Wave-by-Wave Prediction for Spread Seas using a Machine Learning Model with Physical Understanding, Ocean Engineering, 2023, 9 pages.
Raissi, M., Physics-Informed Neural Networks: A Deep Learning Framework for Solving Forward and Inverse Problems Involving Nonlinear Partial Differential Equations, Journal of Computational Physics, Feb. 1, 2019, pp. 686-707, vol. 378.

* cited by examiner

SYSTEM AND METHOD FOR WAVE PREDICTION

RELATED APPLICATIONS

This is a continuation of application Ser. No. 17/435,684, filed Sep. 1, 2021, which is a 371 national stage filing of International Application No. PCT/US2020/020703, filed Mar. 2, 2020, which claims the benefit of the priority of U.S. Application No. 62/812,838, filed Mar. 1, 2019, each of which is incorporated herein by reference in its entirety.

GOVERNMENT RIGHTS

This invention was made with government support under Grants DE-EE0007173 awarded by the Department of Energy. The government has certain rights in the invention.

BACKGROUND

Deterministic Sea Wave Prediction (DSWP) is a field of research that has the aim of predicting forces and motions of sea-going structures and enable powerful feed-forward controls algorithms. DSWP enables ocean waves to be predicted minutes into the future. Ocean waves are the primary driver for excitation forces and motions of systems at sea and the future knowledge of these quantities enables the utilization of powerful control algorithms to maximize power capture and minimize loads. This, in turn, provides a set of enabling capabilities that have the potential to significantly improve the economics of a wide range of marine renewable energy technologies. The two main applications include: (1) maximizing power capture of WEC devices using optimal control; and (2) identifying quiescent windows to carry out sensitive marine operations in large waves, which may include the launch and recovery of small vessels, helicopter landings on ship-deck, personnel transfer between vessels, or sensitive lift operations. These and similar activities are subject to limited operational periods due to wave-induced motions that can damage equipment and endanger personnel. Other fields that benefit from predictive wave information include enabling optimal control using feed-forward control algorithms in wave energy converters and floating offshore wind (FOW) turbines.

The prediction of ocean waves is not a trivial undertaking—real waves are highly irregular and directional in nature, and to identify them and model their spatial and temporal variation accurately is a challenge. Ocean wave-field evolution involves many complicated dynamic processes, including wind input via air-sea interactions, non-linear energy transfer through wave-wave interactions, wave dissipation caused by surface breaking and bottom friction, and characteristics variations under the effect of environmental current and bottom bathymetry. The state of the art in wave-prediction is largely academic and numerous papers have been presented. Most efforts have focused on enhancing wave prediction by utilizing higher-order physics-based wave propagation models. Validation of these approaches has largely been conducted in directional wave basins and wave flumes that allow for the creation of wave-fields at reduced scale. Where researchers worked with directional wave-fields, the wave-direction is identified using triangulation approaches from three or more probes that take measurements in vertical direction only using either wave gauges in wave tanks or platform-mounted pressure sensors in the open ocean. Our identification of prior art showed a total of 39 publications. None of them leveraged xyz measurements directly to identify the directional wave components and none of them implemented the algorithm frameworks to produce outputs in real-time. The major ones are briefly reviewed in the following summaries:

Prislin and Zhang (1997) developed a method to deterministically decompose nonlinear short-crested irregular ocean waves accurately up to second order in wave steepness based on pressure measurements. The wave characteristics of the wave field were predicted in the vicinity of multiple fixed-point measurements based on the derived free-wave components.

Zhang et al. Part I (1999) reported development of a directional hybrid wave model (DHWM) for deterministic prediction of short-crested irregular ocean waves based on pressure measurements. In Zhang et al. part II (1999), the authors applied their DHWM to laboratory and ocean wave measurement data to produce a reasonably accurate wave prediction from a reference sensor to a point a few tens of meters away, although the error between the predicted and the field measurements increased in comparison with the laboratory-measured signals.

Meza et al. (1999) developed a deterministic method for wave elevation prediction based on pressure measurements and using a wave model (HWM). While they found that the predicted wave elevation using the HWM was in excellent agreement with the measured elevation in tank test measurements, large discrepancies were reported using a linear wave theory (LWT). Furthermore, the predicted wave elevation using HWM is not sensitive to the choice of cut-off frequency. However, HWM used in their study was limited to only unidirectional waves.

Wu (2004) developed a multi-level iterative wave reconstruction tool to deterministically reconstruct a nonlinear ocean wave-field based on single or multiple wave probe records using both analytic low-order Stokes solution and Higher-Order-Spectral (HOS) nonlinear wave model. The reconstructed wave-field the ocean wave-field was forecasted into the future with a physics-based phase-resolved wave model. Excellent agreement was found between the reconstructed nonlinear wave-field and the original specified wave data.

Halliday et al. (2011) explored the use of FFT for decomposition and reconstruction of wave records taken at fixed locations and obtaining predictions at different temporal and spatial points in the wave domain. They observed that the periodic nature of the FFT does not fit comfortably with the continuous non-periodic signal it is usually fed with. They also found that the predictions work well only for short distances and their validation is only limited to wave-tank environment.

Daniele Cavaglieri (2016) developed a novel framework using an Ensemble Kalman Filter (EnKF) for the short-term prediction of ocean waves. His approach leveraged an IMEX Ranga-Kutta schemed for the highly resolved simulation of the nonlinear equations used to describe wave propagation. He found that by using an EnKF method for data assimilation of wave measurement data it is possible to accurately forecast the nonlinear wave field up to 30 s into the future. His work used wave elevation measurements of multiple probes to determine direction through a triangulation approach. No physical validation was carried out. Klein et al. (2017) present a numerical and experimental study on the applicability and limitations of different prediction methods: linear wave solution, non-linear Schrodinger equation (NLSE) of two different orders and a HOS method. The accuracy of prediction was evaluated using the surface similarity parameter (SSP) and validated their method with controlled wave tank tests. They showed that for waves with smaller steepness the linear method provides results with the same accuracy as the more complex methods. For increasing wave steepness, where nonlinear effects are more dominant, the NLSE results show that this method is not applicable to DSWP of arbitrary irregular sea states compared to other methods. They also found that the inclusion of the exact linear dispersion operator within the linear dispersive part of the NLSE increased the accuracy of the prediction for small wave steepness significantly. From a non-linear DSWP point of view the HOS prediction based on waveTUB input provides higher accuracy over a wide range of applications.

The state of the art in wave measurement is a movement towards GPS-based solutions, which may be platform- or vessel-based, or integrated into a free-drifting or moored buoy. One example of such a buoy is described by Pierik, et al, in U.S Patent Publ. No. US2018/0275313, which combines GPS and satellite communication systems with inertial measurement sensors and acoustic sensors in a solar-powered buoyant housing to collect ocean wave and surface current data. Another example is the commercial WAVERIDER® buoy (Datawell, NL) that allows for the measurement of XYZ buoy motion and has a real-time RF telemetry option that allows the user to transmit data in real-time to an end-user. WAVERIDER® identifies XYZ buoy motion using an Inertial Measurement Unit (IMU).

BRIEF SUMMARY

The inventive system and method relate to a wave forecasting framework that predicts ocean waves within a time-horizon of seconds to minutes into the future. The inventive approach involves a combination of individual techniques that allows for: (1) accurate identification of the wave systems' spectral components; (2) combining multiple sensor measurements using sensor fusion approaches; and (3) the propagation of ocean waves to a target location using physics-based models and relevant correction methods.

In some embodiments, innovations include: (1) the direct utilization of x,y.z motion data of a wave measurement instrument to identify the directional wave-field, reducing the number of measurement probes required by at least a factor of three, reducing complexity and cost. (2) The use of a sliding window method to enable a continuously updated wave prediction that provides a useful output for integration with operational systems at sea and making the wave prediction data actionable.

The DSWP methods and system disclosed herein have the potential to improve the operational characteristics of a wide range of sensitive marine operational activities and enable feed-forward controls frameworks to be applied. The DSWP scheme employs an algorithm framework that utilizes the measurements of XYZ surface displacements to identify the wave-field, propagate the identified wave-field forward in time and space and provide a predicted wave-field at a target location.

In some embodiments, linear wave propagation is used and is based on the principle that linear waves can be super-imposed to form the free surface. The propagation speed of individual components can be computed using the dispersion relationship. To propagate a wave-field, the spectral components (also referred to as Fourier coefficients) of the wave-field are identified. These spectral components are amplitude, direction, and phase as a function of frequency. Once the components are identified, they can be propagated using linear wave-theory in time and space. The propagated components can at that point be superimposed to provide a surface prediction at the target output location and time of interest.

Alternative phase-resolving wave models to propagate the wave-field in space and time can be utilized. The wave systems identification process is used to establish the boundary conditions. These models include among others those based on either the Boussinesq equations, the MildSlope Equations (MSEs), nonlinear spectral models, Higher Order Spectral Models (HOS), potential flow models, and Navier-Stokes. Many of these models are currently not real-time capable but may become real-time capable at some point in the future. These physics-based wave models can also be replaced by a neural network approach that uses the boundary conditions (measurements) as inputs and learns to make predictions by training the neural network.

The inventive method employs a three-step process: (1) measurement of the ocean free-surface using a measurement device and transmission of these measurements to a central controller that runs our wave-prediction algorithm; (2) identification of the wave-field and fusion of measurement sources, (3) propagation of the wave-field in space and time. An optional fourth step incorporates correction methods to account for errors in the physics-based propagation model.

The quality of a model forecasted wave-field is strongly dependent on the accuracy of the initial condition (which is an estimate of the present sea-state obtained by the experimental data collected near the prediction horizon). Data assimilation is one such process which combines the experimental observations to the wave model to find the most accurate condition for the prediction initialization. The parameters involved in the data assimilation procedure are: measured probe record (x, y and z wave elevation data, latitude and longitude, depth of wave propagation) and probe motion analysis; derived wave parameters extracted from the spectral content, which allows a good reconstruction of the wave-field from the measured data; and transfer function to go from the derived parameter formulation space to the physical space of wave elevation at the destination location (full-length propagation).

Phase-resolved wave-prediction is of interest in two main application areas: (1) enabling optimal control in wave energy conversion (WEC) devices, and (2) ship- or platform-motion prediction to improve the safety of marine operational activities at sea. For optimal control of ocean wave energy conversion (WEC) devices, feed-forward controls methods (typically model predictive control) can be leveraged to improve the performance of WEC devices. These control methods require a forecast of the wave-excitation forces acting on the structure to be truly optimal, which can be computed from a future estimate of a phase-resolved wave-field. For ship-motion prediction, many offshore operational activities such as transfer of personnel from one ship to another, the landing of a helicopter on a ship deck, fuel and cargo transfer, ship-docking, etc., require the platform and ship to be relatively stable. Being able to predict ship motions allows operations to be carried out more safely. The wave-prediction can also be used to optimize the ship's orientation and speed to traverse large waves safely. Additional applications include prediction of extreme wave impacts to enable a wide range of marine operations, and minimization of resonance modes and platform motions for floating deep-water offshore wind turbines prediction to facilitate automated control to minimize motion, safe passage through rough seas, or reduced fuel consumption. Benefits of the inventive approach include the ability to leverage different types of measurement sources and a reduction of the number of sensors required by a factor of three due to the direct utilization of XYZ probe displacements to identify the wave-field. The inventive method is computationally efficient and allows for parallel execution of time-critical processes making it real-time capable. This results in a minimal time-lag between measurement and prediction.

In an exemplary embodiment, wave measurement data is collected using one or a combination of moored wave measurement buoys, unmanned surface vehicles (USV), also referred to as "autonomous vehicles", that can be dynamically positioned to allow waves to be measured by using GPS and/or IMU's and compass. These USV platforms can be thought of as dynamically positioned measurement buoys that do not require a mooring system. Additional data may be obtained using one or a combination of subsea pressure transducers, subsurface position measurements, radar mounted on an air-borne or ship platform, lidar or laser mounted on an airborne platform, radar mounted on a satellite platform, and lidar or laser mounted on a satellite platform.

The use of autonomous vehicles is advantageous in real-time wave prediction applications, because: (a) wave directions and periods change over time, and (b) to enable wave prediction, measurements must be taken up-wave of a target prediction location. As a result, the optimal locations to measure waves change as a function of the wave-field. Being able to dynamically reposition the wave measurement probes through the use of autonomous vehicles provides a significant improvement in wave prediction with a minimal number of sensors.

In some embodiments, the measurement system employs real-time kinematic (RTK) positioning, a known technique for enhancing precision of satellite-based positioning techniques such as GPS. Briefly, RTK uses a GPS correction that compensates for atmospheric distortion and other errors introduced in typical GPS positioning applications to enable a more accurate position measurement. Sensor fusion between RTK-GPS and IMUS improves RTK-GPS resilience and robustness of the measurements. Additionally, sensor-fusion algorithms could be leveraged to combine multiple point measurements in the inventive system, including the use of ensemble Kalman filters (EnKF) and other particle filters.

In one aspect of the invention, a method for prediction of wave properties at a target location within a body of water includes using a computer processor to collect a data stream of time series data from at least one wave measurement device located within the body of water at a location having location data comprising x, y and z coordinates; define an initial time-history within the data stream, the initial time-history having a predetermined time length starting at a start time and extract location data for the initial time-history; calculate wave components by transforming the time and location data into a frequency domain to identify amplitude, phase and direction components in the frequency domain; propagate a wave model to the target location within the body of water using the wave components to estimate wave elevation, wave direction and wave velocity based on the initial time-history; generate an output indicating one or more of the estimated wave elevation, direction and velocity at the target location; and increment to a subsequent time-history within the data stream and repeat the calculate, propagate, and generate steps for a series of subsequent time-histories, wherein each subsequent time-history partially overlaps a preceding time-history, and wherein a continuous, real-time prediction of wave properties at the target location is generated.

In some embodiments, the computer processor is a central processor remotely located from the at least one wave measurement device, where the at least one wave measurement device comprises a transmission system configured to transmit the stream of time series data to the computer processor continuously in real time. The at least one wave measurement device may be a plurality of wave measurement devices, where each wave measurement device is in substantially continuous communication with the central processor to transmit multiple data streams to the central processor. In such embodiments, the computer processor combines the time series data from the plurality of wave measurement devices. The time series data from each of the plurality of wave measurement devices should be time aligned. The time series data from the plurality of wave measurement devices may be combined by dividing the time series data into directional sectors corresponding to a relative position of each wave measurement device to the target location. The relative position is determined according to one or more of x,y direction, x or y distance, or radial sectors.

The wave measurement device can be selected from the group consisting of a buoy, a platform, a float, a boat, a ship, a submerged vehicle, an autonomous vehicle, and an instrument suspended from or mounted on a buoy, a platform, a float, a boat, a ship, a submerged vehicle or an autonomous vehicle. In some embodiments, the wave measurement device is an autonomous vehicle having a navigation system, where the computer processor provides a control signal to the navigation system to reposition the vehicle to an up-wave position relative to the target location in response to sea-state conditions.

In some embodiments, the computer processor is configured to correct for drift of the at least one wave measurement device from the x and y positions using location data, or correct for device velocity or water current. The computer processor may also iteratively correct one or more of the spectral components and wave model input parameters using an error minimization algorithm. The error minimization algorithm may include an iterative procedure of collecting time series measurements at the target location, comparing predicted wave properties at the target location, determining whether an error is detected and, if an error is detected, correcting the prediction process. The location data may be one or a combination of GPS data, real-time kinematic (RTK) positioning data, and Inertial Measurement Unit (IMU) data.

The output generated by the method may include a signal transmitted to a notification system configured to generate a detectable indicator when one or more of the predicted wave properties exceeds a predetermined threshold.

In another aspect of the invention, a system for predicting wave properties at one or more targets location within a body of water includes at least one wave measurement device located within the body of water, the at least one wave measurement device to generate a data stream of time series data comprising location data having x, y and z coordinates; and a computer processor in communication with the at least one wave measurement device for receiving the data stream and processing the time series data to: define an initial time-history within the data stream, the initial time-history having a predetermined time length starting at a start time and extract location data for the initial time-history; calculate wave components by transforming the time and location data into a frequency domain to identify amplitude, phase and direction wave components in the frequency domain; use the identified wave components to initialize the boundary conditions of a physics-based wave propagation model and propagate this wave model to the one or more target location within the body of water; generate an output indicating one or more of the estimated wave properties, including: elevation, direction and velocity at the target location; and increment to a subsequent time-history within the data stream and repeat the calculate, propagate, and generate steps for a series of subsequent time-histories, wherein each subsequent time-history partially overlaps a preceding time-history, and wherein a continuous, real-time prediction of wave properties at the target location is generated.

The at least one wave measurement device may be selected from the group consisting of a buoy, a platform, a float, a boat, a ship, a submerged vehicle, an autonomous vehicle, and an instrument suspended from or mounted on a buoy, a platform, a float, a boat, a ship, a submerged vehicle or an autonomous vehicle. In a preferred embodiment, the wave measurement device is an autonomous vehicle having a navigation system, and wherein the computer processor is further configured to provide a control signal to the navigation system to reposition the vehicle to an up-wave position relative to the target location in response to sea-state conditions.

The computer processor may be a central processor remotely located from the wave measurement device, where the wave measurement device includes a transmission system for transmitting the stream of time series data to the computer processor continuously in real time. A plurality of wave measurement devices may be used, where each wave measurement device is in substantially continuous communication with the central processor to transmit multiple data streams to the central processor. The computer processor combines the time series data from the plurality of wave measurement devices. The time series data from each of the plurality of wave measurement devices should be time aligned and may be combined by dividing the time series data into directional sectors corresponding to a relative position of each wave measurement device to the target location. The relative position can be determined according to one or more of x,y direction, x or y distance, or radial sectors.

In some embodiments, the computer processor can also correct for drift of the wave measurement devices from the x and y positions using location data, and for device velocity or water current. The computer processor may also iteratively correct one or more of the spectral components and wave model input parameters using an error minimization algorithm, where the error minimization algorithm includes an iterative procedure of collecting time series measurements at the target location, comparing predicted wave properties at the target location, determining whether an error is detected and, if an error is detected, correcting the prediction process. The location data may be one or a combination of GPS data, real-time kinematic (RTK) positioning data, and Inertial Measurement Unit (IMU) data.

The system may further include a notification system in communication with the computer processor for generating a detectable indicator when one or more of the predicted wave properties exceeds a predetermined threshold and/or transmit predicted wave time-series data or predicted spectral data to a control system to optimize the motion response of a floating or submersed system, such as a wave energy converter or a ship.

BRIEF DESCRIPTION OF THE DRAWINGS

FIG. 6A shows a first slide with a time-offset of 10 s (window 1), FIG. 6B shows a second slide with a time-offset of 10 s (window 2), and FIG. 6C shows a third slide with a time-offset of 10 s (window 3).

DETAILED DESCRIPTION OF EMBODIMENTS

Definitions

Figure 1:
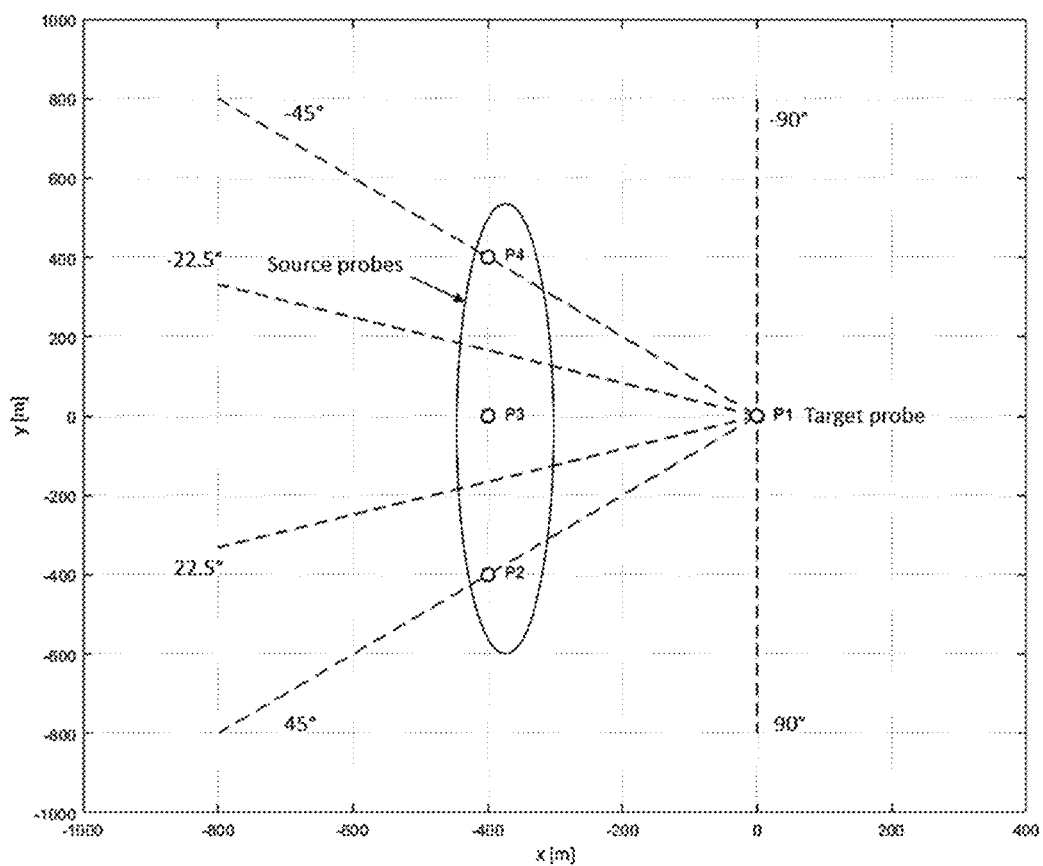
FIG. 1 is a diagram of an embodiment of a multiple probe layout and directional discretization.

A "probe" or a "wave measurement device" means a buoy, platform, float, boat or ship, unmanned drone, submerged vehicle, an autonomous vehicle, or any other structure that supports a sensor that can be used for detecting fluid particle motion within a body of water. The sensor may be positioned at the free surface of the water or may be suspended below the surface, e.g., through the use of weights, anchors, or thrusters, as in an unmanned underwater vehicle (UUV). In addition to the sensor, the probe may include electronic instrumentation including a computer processor and associated memory device(s) for data storage, and a communications system including receiver(s) for receiving GPS (global positioning system) data, and transmitters or transceivers for transmitting raw measurement data or processed measurement data to a central computing system and/or an interface to an end user.

A "source" or "source probe" means a probe whose measurement data is taken as an input.

A "target" means a location at which the wave predictions are made. A target probe may be located at the target location.

As described in more detail below and with reference to the accompanying figures, the inventive approach obtains ocean free-surface measurement from one or more wave measurement buoys, each of which outputs x, y, and z position, displacement and/or velocity data, as well as location data, which may be obtained from a GPS, RTK, IMU or similar system. That data is transmitted continuously in real-time to a central computer that synchronizes data from multiple measurement buoys, processes those measurements, and provides a wave-prediction at one or more output locations within the spatial domain.

The inventive wave forecasting framework described herein predicts ocean waves within a time-horizon of seconds to minutes into the future. In some embodiments, the inventive scheme combines individual techniques for: (1) accurate identification of the wave systems Fourier components (amplitude, phase and direction as a function of frequency); (2) combining multiple sensor measurements using sensor fusion approaches; and (3) the propagation of ocean waves to a target location using physics-based models and relevant correction methods. In other embodiments, physics-based wave models can potentially be replaced or augmented by an adaptive algorithm, an artificial neural network (ANN), or other learning machine, referred to collectively as "learning machines" or "AI", trained on real in-ocean data, using the boundary conditions (measurements) as inputs and making predictions therefrom. Examples of such learning machines include, but are not limited to, decision trees, support vector machines, genetic algorithms, convolutional neural networks (CNN), as are known in the art. In still other embodiments, a hybrid approach may include a combination of physics-based models and learning machines, in which some, but not all of the steps within the basic method are executed by a learning machine.

Ocean waves can be described based on the principle that individual wave components can be super-imposed to form the free surface. The propagation speed of individual components can be computed using the dispersion relationship. To propagate a wave-field, first we have to identify the spectral components (also referred to as Fourier coefficients) of the wave-field. The spectral components are amplitude, direction, and phase as a function of frequency. Once the components are identified, they can be propagated using linear wave-theory in time and space or the wave components, i.e., wave model input parameters, can be used to provide the boundary conditions for any other physics-based wave model. The propagated components can then be super-imposed to provide a surface prediction at the target output location and time of interest.

Alternative phase-resolving wave models to propagate the wave-field in space and time can be utilized. The wave systems identification process is used to establish the boundary conditions. These models include among others those based on either the Boussinesq equations, the MildSlope Equations (MSEs), nonlinear spectral models, Higher Order Spectral Models (HOS), potential flow models, and Navier-Stokes. Many of these models are not currently real-time capable, but may become real-time capable at some point in the future.

Ocean free-surface measurement: For ocean free-surface measurement, we used a wave measurement device that outputs x, y, z displacement data, as well as GPS position data, i.e., latitude, longitude, and altitude. That data is transmitted continuously in real-time to a central computer that processes those measurements and provides a wave-prediction within the spatial domain of interest. Alternatives to measuring the free surface using a moored directional wave measurement buoy may include:

Measuring the free surface using one or more unmanned surface vehicle (USV) that can be placed into the ideal up-wave location to maximize wave-prediction accuracy. (To illustrate, referring to FIG. 1, with the wave direction as indicated moving from left to right, probes P1, P2 and P3 are up-wave of target probe P4.) It should be understood that there is an optimal location where measurement should be taken using a point measurement. This optimal location depends on the prediction horizon, directionality of the wave-resource and wave-periods of interest. Using multiple buoy measurements can improve the forecasting accuracy by combining them using sensor-fusion techniques. The code framework used in the test system is able to ingest data from a non-fixed (moving) x, y, z measurement source. The free surface movement of this USV can be measured using either GPS positioning data or an Inertial Measurement Unit (IMU) measurement package.

Measurement of the free surface using subsea-pressure sensors. Pressure sensor arrays are frequently used to measure wave-heights by relating subsea pressures to wave heights. Using more than one probe, the phase-shift of the measurements can be used to identify the wave-direction.

Figure 2:
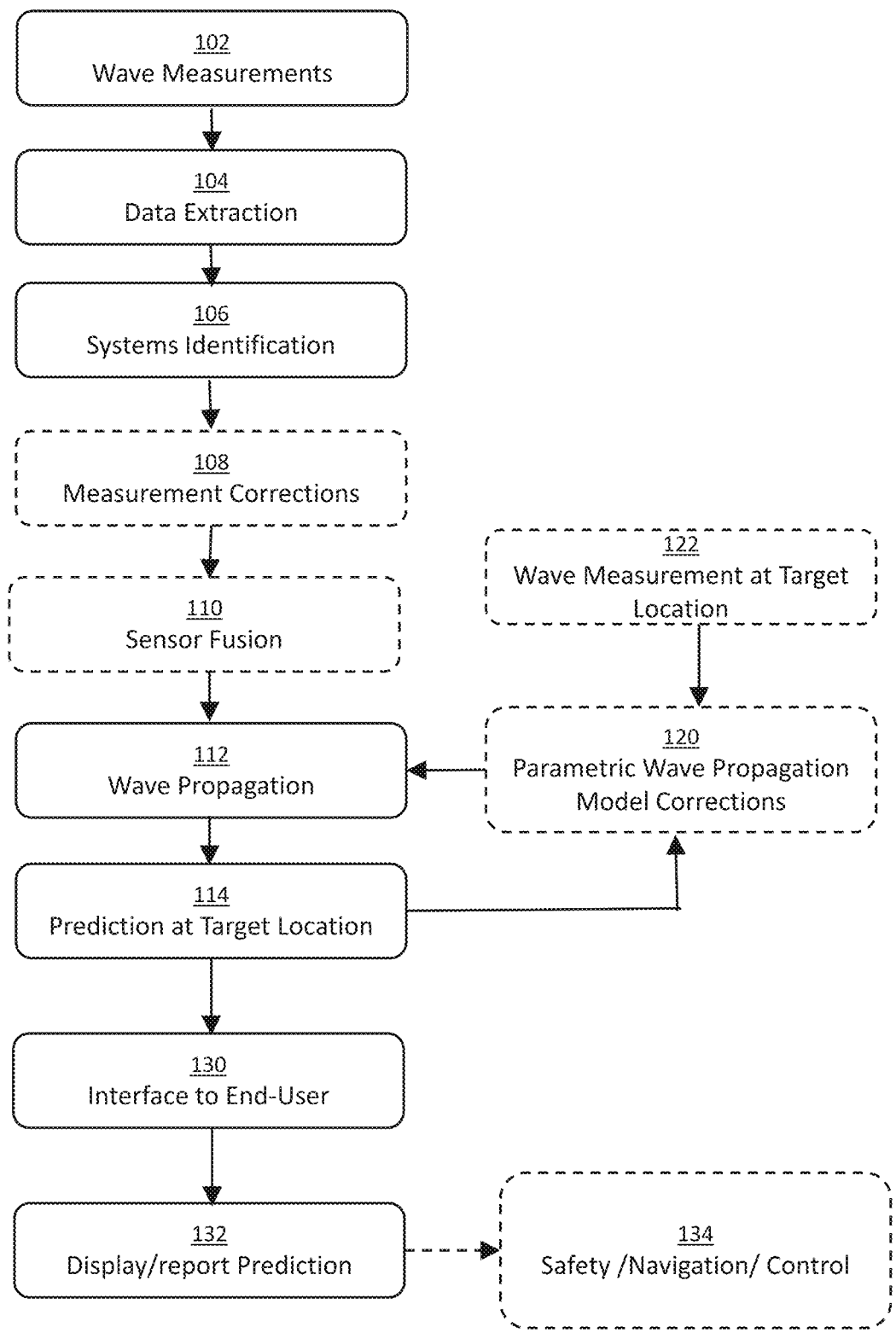
FIG. 2 is a flow diagram of an exemplary process for wave prediction.

The DSWP process employs three main steps that may be augmented by one or more correction steps that allow for the measurement and prediction process to be optimized. Because the system identification step used to identify the waves requires a time-history of data with a length on the order of 100 s-500 s, in an exemplary embodiment, a sliding window approach is used to march forward in time and provide a continuously updating wave forecast as an output. Alternatively, a stacked window approach may also be used. The steps are illustrated in the flow diagram of FIG. 2.

In step 102, wave measurements are obtained. Waves are measured at one or more locations up-wave of the wave prediction target. In a test system, data were recorded at a sampling rate of 5 Hz. As will be apparent to those in the art, other sampling rates may be selected. The collected data includes the following parameters:

1. x, y, z position of the probe relative to a fixed reference in space;
2. time, which may be obtained from a GPS timestamp or from a system-wide clock;
3. GPS position, including latitude, longitude and altitude; and
4. water depth.

Each of the above parameters may be directly measured using a GPS-based wave measurement buoy. A single wave measurement device may be used with its own on-board computer processor, or each buoy may be remotely linked via a conventional communication system to a central processor. In some embodiments, the data are transmitted over a radio frequency (RF) wireless link to the central processor, which processes the data. An important feature of the communication system is that the data are streamed continuously to allow real-time updating of parameters. Within the central processor, the relevant data are extracted from the transmitted data in step 104.

Systems identification occurs in step 106. Ocean waves can be thought of as a superposition of multiple sinusoidal components that describe the deformation of the free surface over time. Each wave-component has an amplitude, frequency, phase and direction. To identify these wave components, the inventive approach uses a Fast Fourier Transform (FFT) on a time-history of measurements to identify the frequency domain ("F-Domain") wave parameters for each probe.

We denote by $X(j\omega)$ the Fourier transform ($\mathcal{F}$) of a signal $x(t)$ in which the Fourier transform is computed using the FFT algorithm. The transform is applied to the probe motion data in x, y and z, which gives $$Z(j\omega) = \mathcal{F}(z(t)), \quad (1)$$

$$Y(j\omega) = \mathcal{F}(y(t)), \text{ and} \quad (2)$$

$$X(j\omega) = \mathcal{F}(x(t)). \quad (3)$$

Let N be the number of identified frequency components from the FFT. The amplitude of the Fourier transform $Z(j\omega)$ is used to estimate the amplitude $A_i$ of different wave components i. The angle of the Fourier transform is used to estimate the phase $\Phi_i$ of each component. The amplitude of the Fourier transforms $X(j\omega)$, $Y(j\omega)$ is used to estimate the direction $\psi_i$ of each wave component as follows:

$$A_i = |Z(j\omega)| \quad (4)$$

$$\Phi_i = \angle Z(j\omega) \quad (5)$$

$$\psi_i = \tan^{-1}\left(\frac{|Y(j\omega)|}{|X(j\omega)|}\right) \quad (6)$$

The free surface elevation (ti (t)) at the measurement location can be estimated/reconstructed using the parameters identified from the Fourier analysis. The estimated/reconstructed wave elevation time series denoted by $\hat{\eta}(t)$ is computed as follows:

$$\hat{\eta}(t) = \Sigma_{i=1}^{N} A_i \cos(\omega_i t + \hat{\phi}_i - \hat{k}_i x \cos(\psi_i) - \hat{k}_i y \sin(\psi_i)). \quad (7)$$

The wave number $\hat{k}_i$ is defined by the dispersion relationship:

$$\hat{\omega}_i^2 = g\hat{k}_i \tanh(\hat{k}_i h), \quad (8)$$

where h is the water depth in meters and g is the acceleration due to gravity in meters/sec$^2$.

Accurate identification of the component parameters is important for wave prediction. Using a relatively short time-record can cause issues in identification of the spectrum, we enhance the process using well-known spectral enhancement methods, examples of which include zero-padding techniques.

In step 108, optional measurement corrections may be employed to enhance the accuracy of the wave prediction. For accuracy, the wave-field should be described relative to a fixed reference in space. In reality, the measurement is oftentimes corrupted by: (1) drift motion of the probe resulting in a change in the wave component phases; (2) relative velocity of the probe, resulting in a shift of the observed wave frequencies; and (3) currents present at the wave measurement location, resulting in an effect that is similar to a probe drift velocity. These position and velocity corrections are particularly important if the measurements are taken from a moving platform such as an Unmanned Surface Vehicle (USV). The following methods may be employed for position correction and velocity correction:

Position Correction: Let $x_0$ and $y_0$ be the starting locations of the probes. Calculate X and Y drift of the probes ($x_D$ and $y_D$) based on the individual time-stamp GPS data available at each time-step. $\hat{A}_i$, $\hat{\omega}_i$, t, $\hat{k}_i$, $\hat{\psi}_i$ are the estimates of amplitude, frequency, time, wavenumber, phase, and direction of wave component i, obtained from the corresponding measured wave elevation data ($\eta_{meas}$) The corrected estimate of the wave elevation at time t after applying the drift correction is given by:

$$\hat{\eta}_{corr} = \Sigma_i^N \hat{A}_i \cos(\omega_i t + \hat{\phi}_i + \hat{k}_i (x_D \cos(\hat{\psi}_i) - x_0 \cos(\hat{\psi}_i) + y_D \sin(\hat{\psi}_i) - y_0 \sin(\hat{\psi}_i))) \quad (9)$$

The same correction process applies to x and y probe data. Using Fourier analysis, this corrected time-series can be brought back into the frequency-domain.

Velocity Correction: A relative velocity of the measurement probe relative to the wave, results in a distortion of the frequency vector, dependent wave numbers and wave velocities. A correction scheme to correct for that relative measurement velocity was proposed by G. Wu, "Direct simulation and deterministic prediction of large-scale nonlinear ocean wave-field", Massachusetts Institute of Technology, 2004. As described, in this thesis, a multi-level iterative wave reconstruction tool was developed to deterministically reconstruct a nonlinear ocean wave-field based on single or multiple wave probe records using both analytic low-order Stokes solution and Higher-Order-Spectral (HOS) nonlinear wave model. The reconstructed wave-field the ocean wave-field was forecasted into the future with a physics-based phase-resolved wave model. The effects of moving probe, ambient current and finite water depth on the predictable region were also studied. The efficacy of the method was validated using both wave-basin measurements and synthetic data. Excellent agreement was found between the reconstructed nonlinear wave-field and the original specified wave data.

Identify Free-Wave Components: A third issue that can occur when identifying a wave is that the waves exhibit a certain degree of non-linearity. This non-linearity disturbs the identification of the main wave components and their propagation speeds. This issue can be addressed by removing the non-linear components and reducing the system to its free-wave components. Methods to do that have been identified in literature. See, for example, J. Zhang, J. Yang, J. Wen, I. Prislin and K. Hong, "Deterministic wave model for short-crested ocean waves: Part I. Theory and numerical scheme," *Applied Ocean Research*, vol. 21, pp. 167-188, 1999. The authors reported development of a directional hybrid wave model (DHWM) for deterministic prediction of short-crested irregular ocean waves. In using the DHWM, a measured wave field is first decomposed into its free-wave components based on as few as three-point measurements. Then, the wave properties are predicted in the vicinity of the measurements based on the decomposed free-wave components. Effects of nonlinear interactions among the free-wave components up to second order in wave steepness are considered in both decomposition and prediction. While the prediction scheme is straightforward, the decomposition scheme is innovative and accomplished through an iterative process involving three major steps. The extended maximum likelihood method (EMLM) is employed to determine the directional wave spreading; the initial phases of directional free-wave components are determined using a leastsquare fitting scheme; and nonlinear effects are computed using both conventional and phase modulation methods to achieve fast convergence. The free-wave components are obtained after the nonlinear effects being decoupled from the measurements. A variety of numerical tests have been conducted, indicating that the DHWM is convergent and reliable.

For a wave-prediction to be physically valid, measurements should be taken up-wave of the prediction target location. The up-wave separation between the prediction target and the measurement probe must be large enough to provide sufficient time to collect enough time-history to identify the physical wave components, perform the wave prediction computational steps, and provide a desired time-horizon for the prediction.

In optional step 110, sensor fusion can be employed to combine measurements in systems that include multiple probes. The sensors can be combined by dividing the measurement into directional sectors based on the relative position of the target to the source(s). As an example, referring to FIG. 1, if there are 3 wave probes (P2, P3, and P4) used as source probes propagating the wave to a target probe (P1), the frequency-domain component data for P3 is truncated between 22.5 degrees and −22.5 degrees to define Sector #1, P2 is truncated to 22.5 degrees to 90 degrees to define Sector #2, and P4 is truncated to −22.5 degrees to −90 degrees for Sector #3. Variations of this approach for use with different numbers of probes will be readily apparent to those in the art. Sensor fusion may also be used to compensate for sensor failures. The result of the sensor fusion is a combined wave component spectrum.

To determine a suitable up-wave spacing of the probe(s) to the target, the propagation speed of the wave and the desired prediction horizon can be used to arrive at an optimal up-wave location for placement of the probe.

To provide a wave prediction, in step 112, the wave field is propagated in space and time to the target by computing wave speed for each component using the dispersion relationship. The wave components identified in previous process steps are used as the boundary conditions to initialize the wave model. The wave model is then propagated to the target location. Using a linear wave model at finite water depth, the wave elevation at the prediction target location $\eta_{pred}$ can be computed as follows:

$$\eta_{pred}(\tau)=\Sigma_i^N \hat{A}_i \cos(\hat{\omega}_i\tau+\hat{\phi}_i+\hat{k}_i(x_T\cos(\hat{\psi}_i)+y_T\sin(\hat{\psi}_i))). \quad (10)$$

The inputs to Equation (10) are the $x_T$ and $y_T$ location of the target probe, wavenumbers, velocities, and the amplitudes and phases of individual wave components obtained from system identification and the travel time of the waves.

Waves traveling from the source to the target are moving at different speeds. Only wave components that reach the target by time τ will be included in the above summation process. Wave propagation speed is related to wave period using the dispersion relationship that is defined by the wave number $k_i$.

$$\omega_i^2=gk_i\tanh(k_ih) \quad (11)$$

$$v_i=g/\omega_i\tanh(k_ih) \quad (12)$$

Step 114 generates the wave prediction at the target location. The outputs at the target location are updated periodically (typically every 1-5 seconds) as the sliding window method is marching forward in time. The outputs include a record of x, y, z wave particle displacement on the free surface, and GPS time. Using transfer functions, this data can be used to predict vessel motions, excitation forces acting on vessels, or structures, or feed into a feed-forward controls optimization algorithm of a wave energy converter.

The resulting prediction output can be stored in a storage medium to create an ongoing record that may be continuously updated, as well as output via a communication system to a local or remote interface for use by an end user (step 130). In step 132, this output may include display on a monitor or other graphic display device, communication to a storage medium, transmitted to a communication device, or input into another processing device or system that further manipulates the data in step 134, for example, to generate a control signal to a navigation control system for adjust for the anticipated wave, or generate an alarm or warning signal, e.g., visual or audible, to indicate an anticipated wave if the wave elevation exceeds a pre-determined height. The output may be further used as feedback to a WEC control system.

In optional step 120, parametric wave propagation model corrections can be implemented to account for un-modeled physics or measurement bias. To do so, past wave-predictions are compared with past measurements to determine an error. These past measurements are obtained using wave measurements taken at the target location in step 122. If errors are identified, an iterative error minimization routine can be run on key physical or non-physical terms to minimize the error. These optimized terms can then be introduced into the active wave-prediction algorithm. Variables used in this error minimization routine include: (1) water-depth, which affects wave propagation speed, (2) spectral amplitudes (F-domain), (3) spectral phase (F-domain), and (4) direction of travel. In an exemplary embodiment, iterative error minimization can be run every 5-15 minutes.

For a wave to be predicted, it needs to be identified at a suitable distance up-wave of the prediction target location. This means that for a given future prediction horizon, wave period and direction, an optimal wave measurement location can be identified. Wave propagation speed is related to wave period using the dispersion relation and can be computed using equations (11) and (12).

Multiple probes can be intelligently combined by using only the most physically relevant part of the short-term directional spectrum from each probe and combining them into a directional short-term spectrum that is most relevant for the desired prediction location. This processing step can be implemented before or after the wave propagation step 114. To improve the prediction, only measurements taken up-wave of the target location should be utilized. Dividing the measurement domain into sectors can allow non-relevant data from one probe up-wave to be clipped and replace it with another probe. A similar approach can be used for creating sectors depending how far up-wave the probe is, so that short-term forecasts utilize probes in close proximity, while longer term forecasts utilize probes further up-wave. The selection of proximity in these models is a function of wave propagation speed.

Sensor-Fusion Algorithms could be leveraged to combine multiple point measurements in the inventive DSWP system. This includes the use of Ensemble Kalman Filter, EnKF and other particle filters and have been explored in previous works by Cavaglieri (2016), which is incorporated herein by reference.

Autoregressive (AR) Models are accurate a few seconds into the future. For very near-term predictions on the order of <5 s into the future, AR models can be more accurate than DSWP systems due to the errors introduced during measurement and wave propagation. To address this issue, an AR model can be added to augment/blend with the DSWP system already in place.

In some embodiments, the preferred approach to continuously ensure that the wave resource is identified in an optimal manner is by measuring the wave from an Unmanned Surface Vehicle (USV). This allows the measurements to be always taken at an optimal location up-wave relative to the prediction target location.

Figure 3:
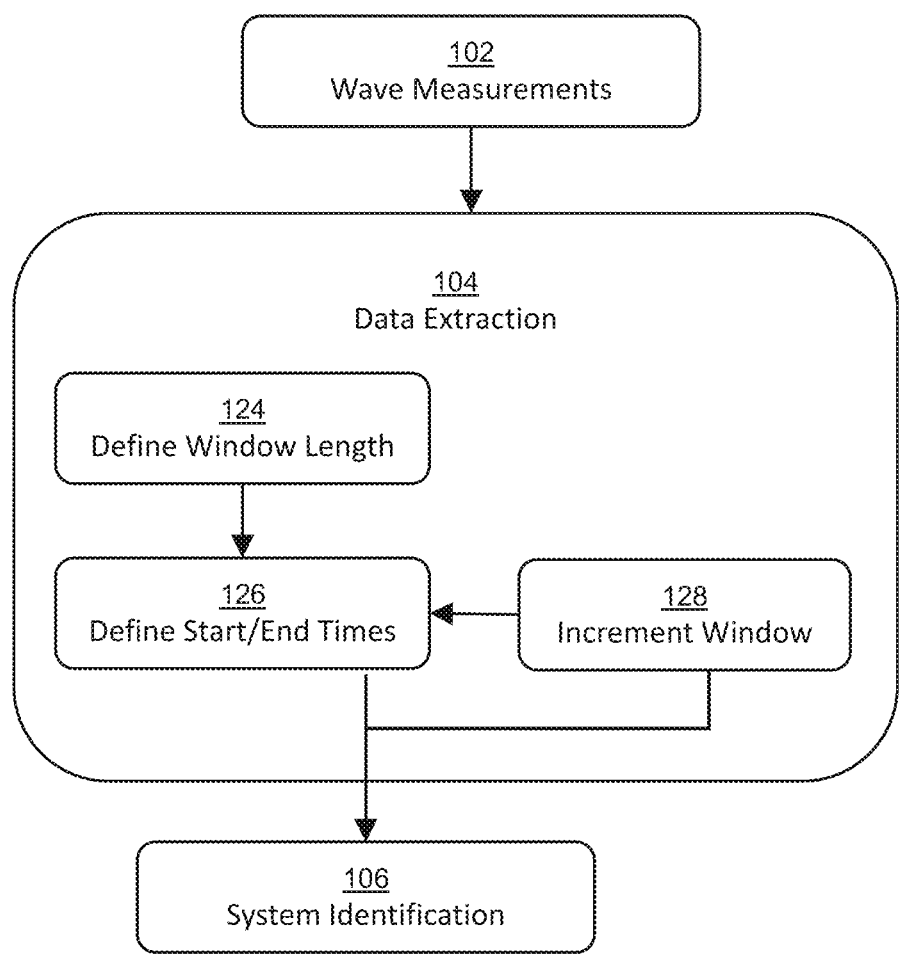
FIG. 3 is a partial flow diagram for the process flow of FIG. 2 with the elements of the sliding window method.

The system identification step 106 used to identify the waves requires a time-history of data with a length on the order of 100 s-500 s. To obtain a forecast (in real-time) in which the modeled waves can be computed more quickly than the actual waves, a real-time prediction algorithm referred to as the "Sliding Window Method (SWM)" is used. The SWM approach is used to march forward in time and provide a continuously updating wave forecast as an output. Referring to FIG. 3, the SWM approach inserts the following steps into data extraction step 104:

Step 124: Define a sliding window length Tw in seconds.

Step 126: Define the sliding window as a record of past measurements with a start-time (Ts) set to the current (most recent) time minus the window length, and the end-time (Te) as the current time.

Pass the sliding window data for the current time window to the systems identification processing step 106.

Compute predictions based on previously defined algorithm process steps 112 and 114 for the current time window.

Move the prediction window forward in time to the next update-interval, i.e., a time offset To, in step 128 and repeat the sliding window process within a continuous stream of data to generate predictions in real time.

Figure 4:
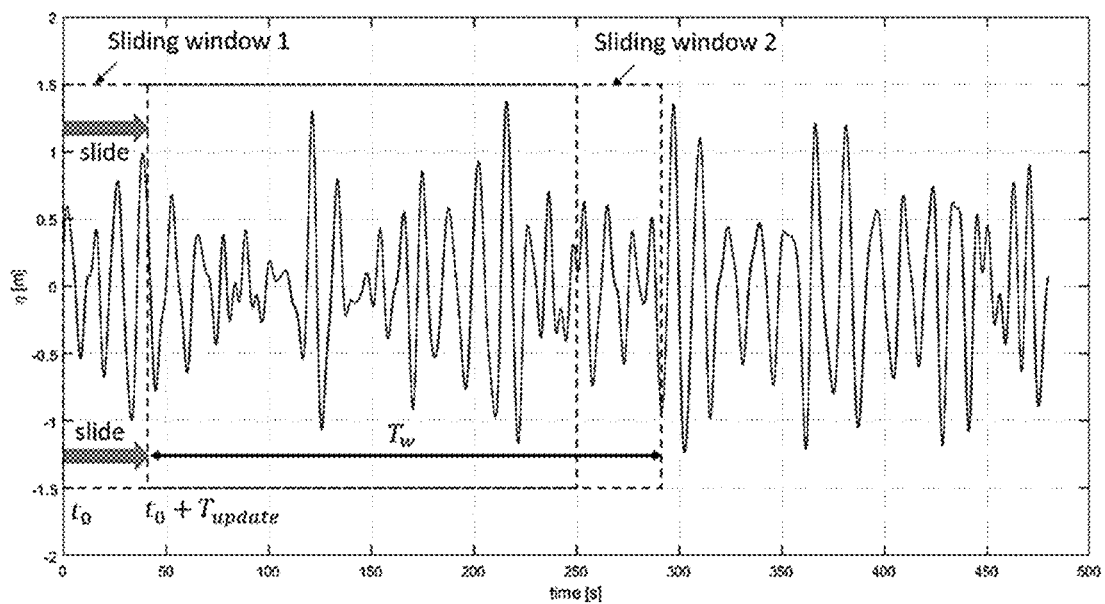
FIG. 4 illustrates the definition of sliding windows within a sample collected time-history.

FIG. 4 illustrates the definition of sliding windows within a sample collected time-history. In the example, within the 500 s time-history, two sliding windows are indicated, each having a length Tw of 250 s with time offsets, or "slides," between sliding window 1 and sliding window 2 of about 45 s.

Figure 5:
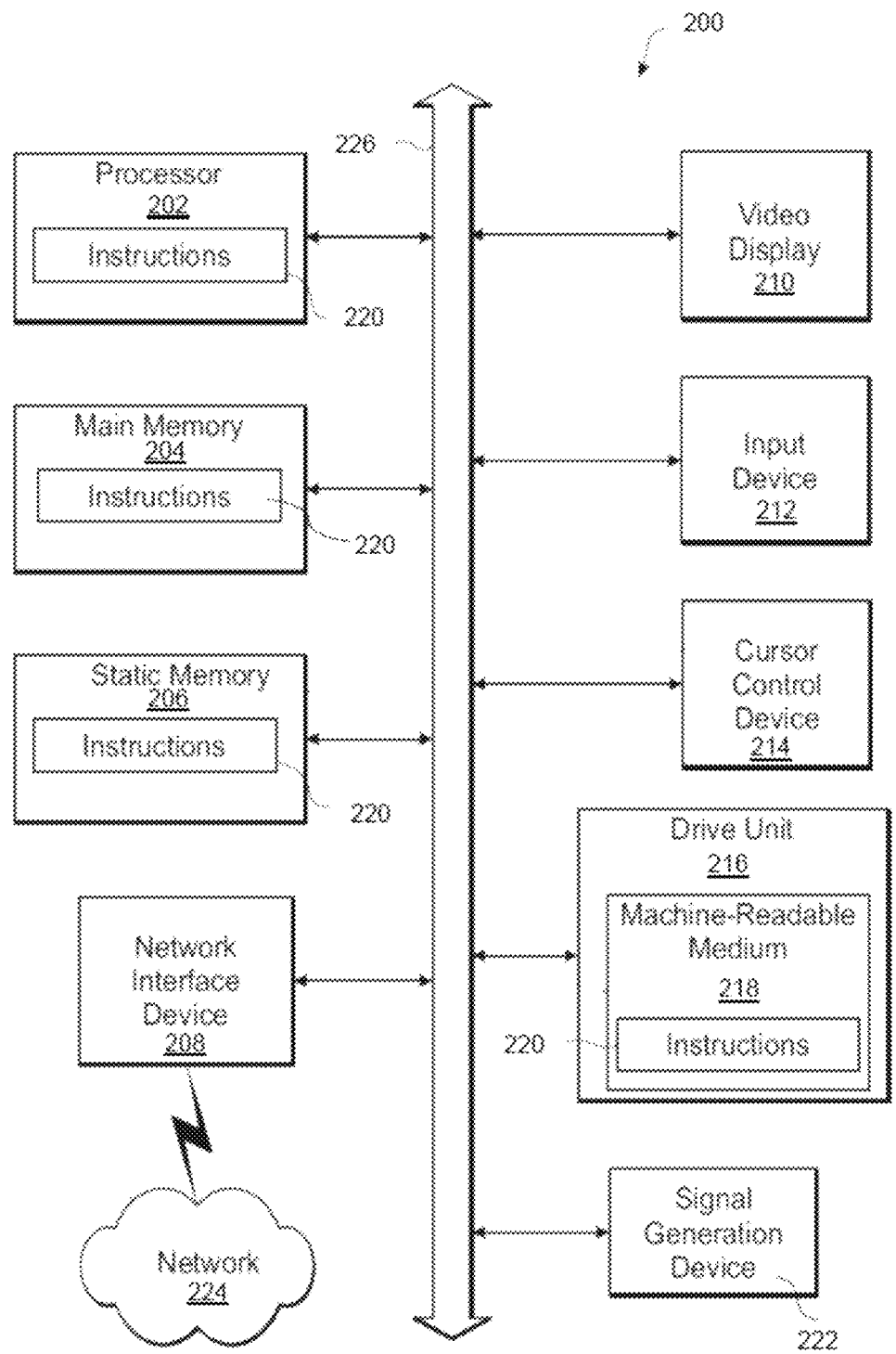
FIG. 5 is a block diagram of an exemplary computing environment for implementation of an embodiment of the inventive method.

FIG. 5 is a block diagram of an exemplary computer system 200 for implementation of the method disclosed herein. The computer system 200 can include a set of instructions that can be executed to cause the computer system 200 to perform the methods or computer-based functions disclosed herein. The computer system 200 or any portion thereof, may operate as a standalone device or may be connected (e.g., using a network 224) to other computer systems or devices disclosed herein. For example, the computer system 200 can include or be included, in part or entirely, within any one or more of the sensors, and/or any other devices or systems disclosed herein.

In a networked deployment, the computer system 200 may operate in the capacity of a server or a client machine in a server-client network environment, or a peer machine in a peer-to-peer (or distributed) network environment. The computer system 200 can also be implemented as or incorporated into various devices, such as a personal computer (PC), a tablet PC, a personal digital assistant (PDA), a web appliance, a communications device, a mobile device, a server, client or any other machine capable of executing a set of instructions (sequential or otherwise) that specify actions to be taken by that machine. Further, while a single computer system 200 is illustrated, the term "system" shall also be taken to include any collection of systems or sub-systems that individually or jointly execute a set, or multiple sets, of instructions to perform one or more computer functions.

The computer system 200 can include a processor 202, e.g., a central processing unit (CPU), a graphics-processing unit (GPU), or both. Moreover, the computer system 200 can include a main memory 204 and a static memory 206 that can communicate with each other via a bus 226. As shown, the computer system 200 may further include a video display unit 210, such as a liquid crystal display (LCD), a light emitting diode (LED), a flat panel display, a solid-state display, or a cathode ray tube (CRT). Additionally, the computer system 200 may include an input device 212, such as a keyboard, and a cursor control device 214, such as a mouse. The computer system 200 can also include a disk drive unit 216, a signal generation device 222, such as a speaker or remote control, and a network interface device 208.

In some embodiments, the disk drive unit 216 may include a machine or computer-readable medium 218 in which one or more sets of instructions 220 (e.g., software) can be embedded. Further, the instructions 220 may embody one or more of the methods, functions or logic as described herein. The instructions 220 may reside completely, or at least partially, within the main memory 204, the static memory 206, and/or within the processor 202 during execution by the computer system 200. The main memory 204 and the processor 202 may also include computer-readable media.

In an alternative embodiment, dedicated hardware implementations, such as application specific integrated circuits, programmable logic arrays and other hardware devices, can be constructed to implement one or more of the methods, functions or logic described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The following provides illustrative examples of different evaluations and variations of the inventive method for wave prediction. It should be noted that these studies were performed using buoy measurements from field campaigns at sea and not from simulated data.

Example 1: SWM Simulation Results

Deterministic Sea Wave Prediction (DSWP) implies a phase-resolved short-term (30-90 sec) prediction of the sea surface elevation to the order of centimeters and seconds accuracy and precision. In this sense, it differs from traditional statistical descriptions of the sea state. This imposes <10 sec computation time and update rate for DSWP system.

Figure 6A:
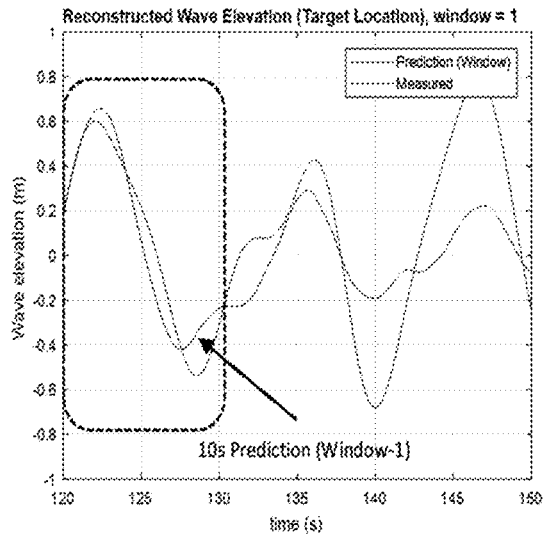
FIGS. 6A-6C are plots of reconstructed free surface wave elevation at the target location for three sliding windows, where
Figure 6B:
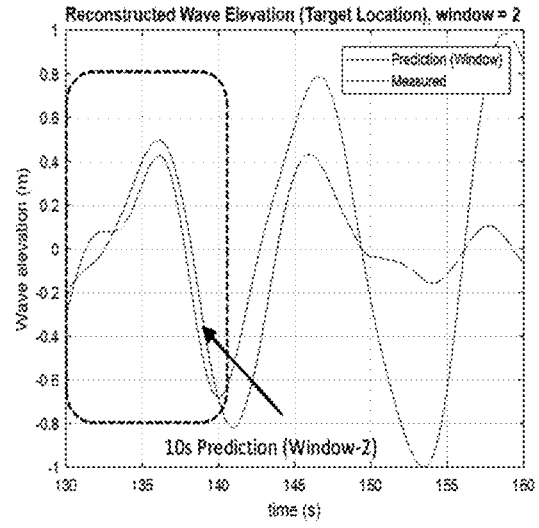
Figure 6C:
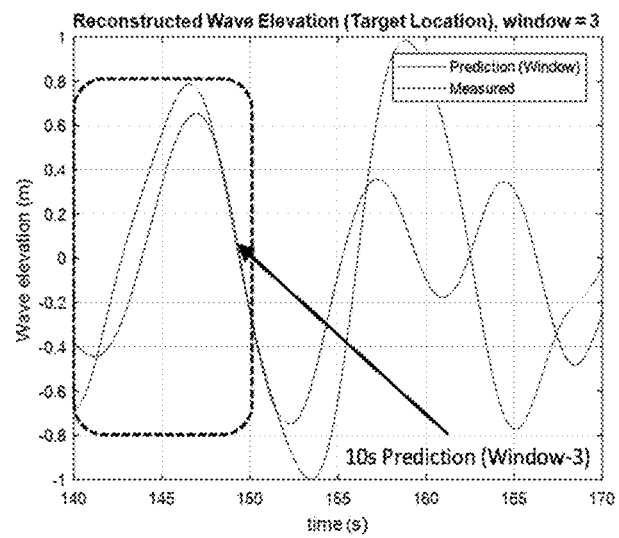

For an initial-time record of 120 s (sliding window length Tw) and an initial time-offset of 10 s (sliding window offset To), comparative simulation results using the SWM method are shown in FIGS. 6A-6C, which provide the predictive simulation results for the first 3-time windows: FIG. 6A—first slide with a time-offset of 10 s (window 1); FIG. 6B-second slide with a time-offset of 10 s (window 2); and FIG. 6C—third-slide with a time-offset of 10 s (window 3). One of the main observations from the windowed prediction is that the first 10 s of the time-window gave reasonably good comparisons with the measured data. Subsequently, the wave elevation data derived from the first 10 s from the best-fit simulation model is then stacked up for small time intervals to assimilate a complete wave elevation record at the target location.

Figure 7A:
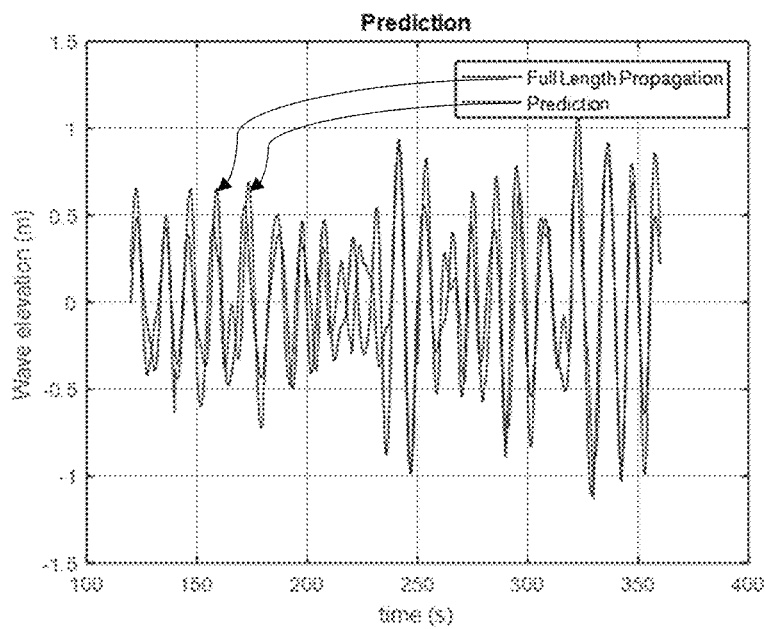
FIGS. 7A and 7B are samples of time traces of predicted and measured wave elevation for test data comparing a full-length propagated wave and real-time prediction (FIG. 7A) and comparing the surface elevation at the target location and real-time prediction (FIG. 7B).
Figure 7B:
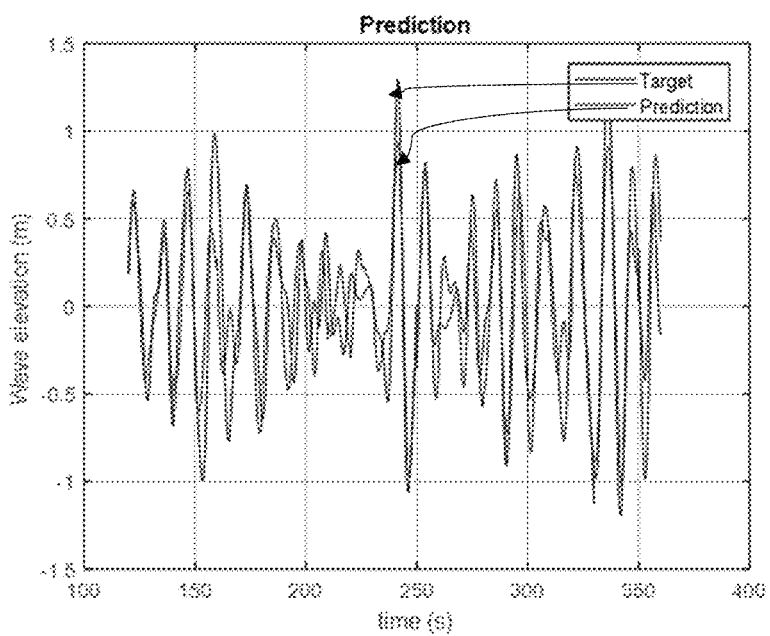

The time trace of the predicted wave elevation data obtained after stacking up information from all the windows culminates into a complete prediction time series as shown in FIGS. 7A and 7B, which show the wave elevation data obtained from the predictions compared to a full-length propagated wave (which used a full-time record) and the actual measured data at the target location, respectively. Importantly, simulation results show that the algorithm produces good agreement between the measured and predicted values.

Example 2: Wave Prediction Accuracy

A sensitivity analysis was carried out to understand the effect of the sliding window length and the sliding window offset in the SWM. To quantify the prediction accuracy, the simulation results of the propagated wave are normalized to the maximum value of the surface elevation at the target location and the error was computed for multiple record lengths.

Figure 8:
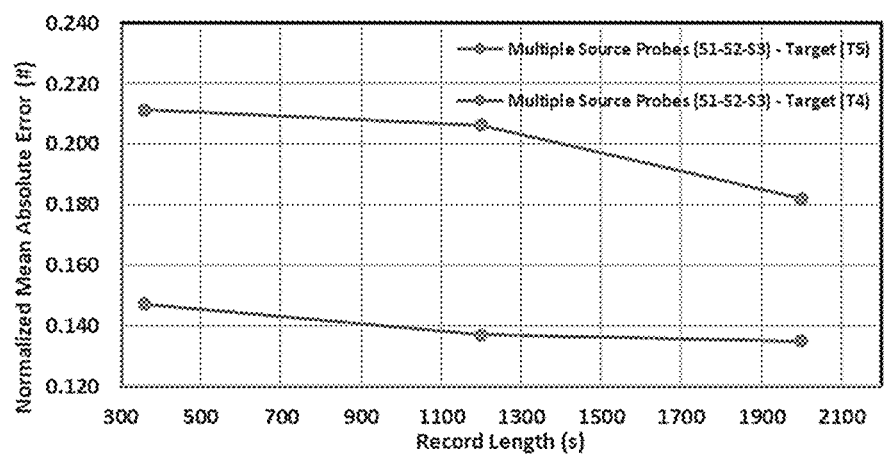
FIG. 8 is a plot comparing normalized mean error for different record lengths using probe combination method (full-length propagation)—Source probes (S1-S2-S3) and Target probe (T4-T5).
Figure 9:
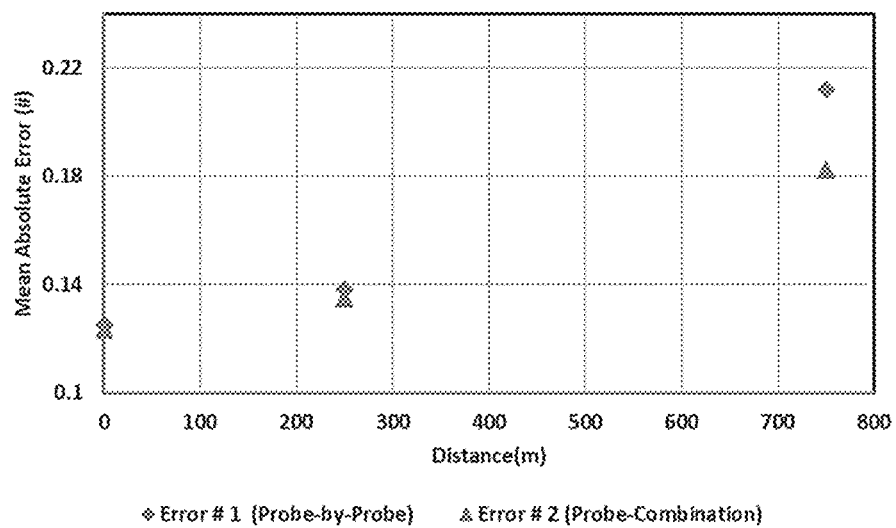
FIG. 9 is an error comparison with probe distance for a point source and a probe combination.
Figure 10:
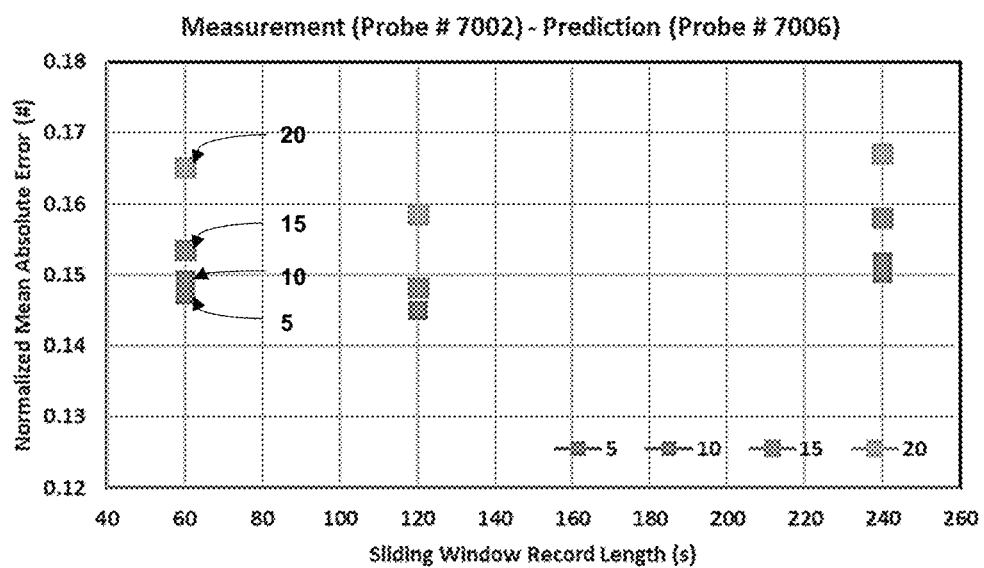
FIG. 10 is a plot comparing normalized mean error for different sliding window lengths and sliding window offsets (real-time prediction) for a first campaign.

1st campaign—To observe the difference in the prediction error between a single point measurement and utilizing multiple probe surface elevation data, simulation results were also performed using a probe combination method to fully characterize the wave-field. FIG. 8 provides a comparison of the normalized mean error for different record lengths for a full-length propagation. A comparison of errors for both methods is shown in FIG. 9. Results of the sensitivity analysis in terms of varying the sliding window length and the sliding window offsets from a real-time prediction standpoint, where the source is probe #7002 and target is probe #7006, are shown in FIG. 10.

Figure 11:
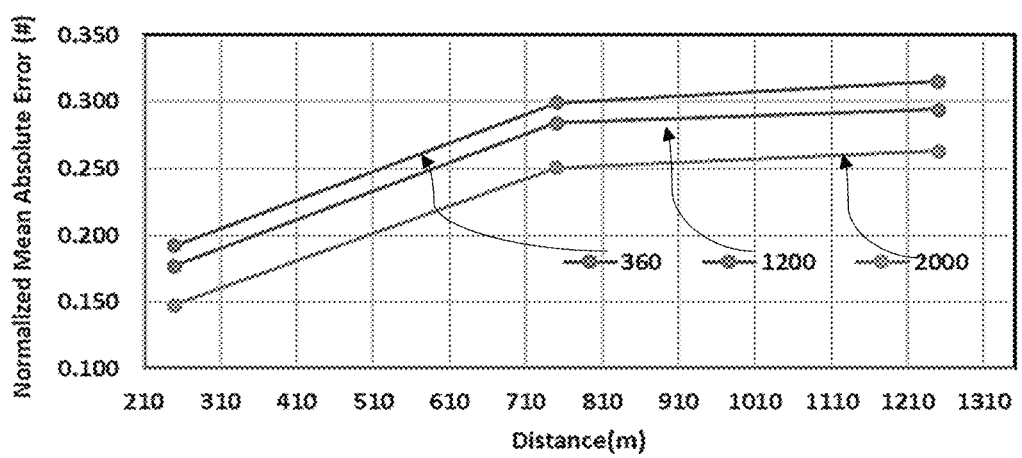
FIG. 11 is a plot comparing mean absolute error with probe distance for different time record lengths using in full-length propagation for a second campaign.
Figure 12:
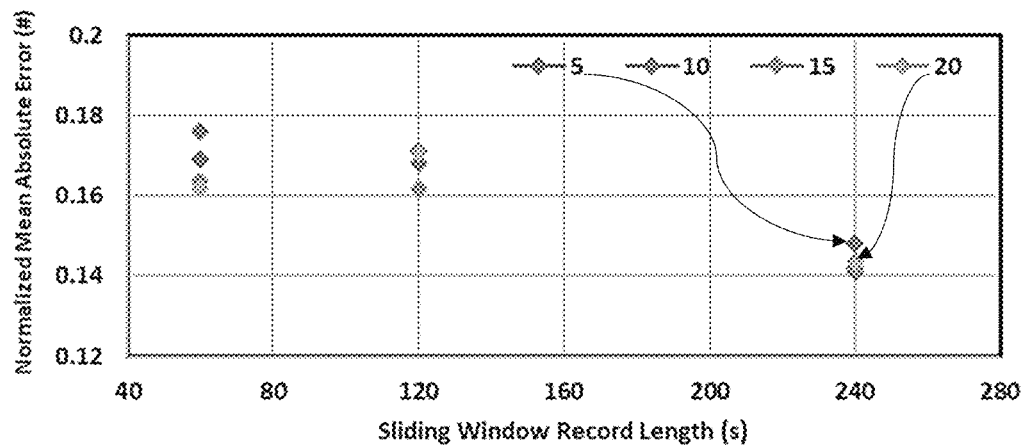
FIG. 12 is a comparison of mean absolute error for different sliding window lengths and sliding window offsets for the second campaign.
Figure 13:
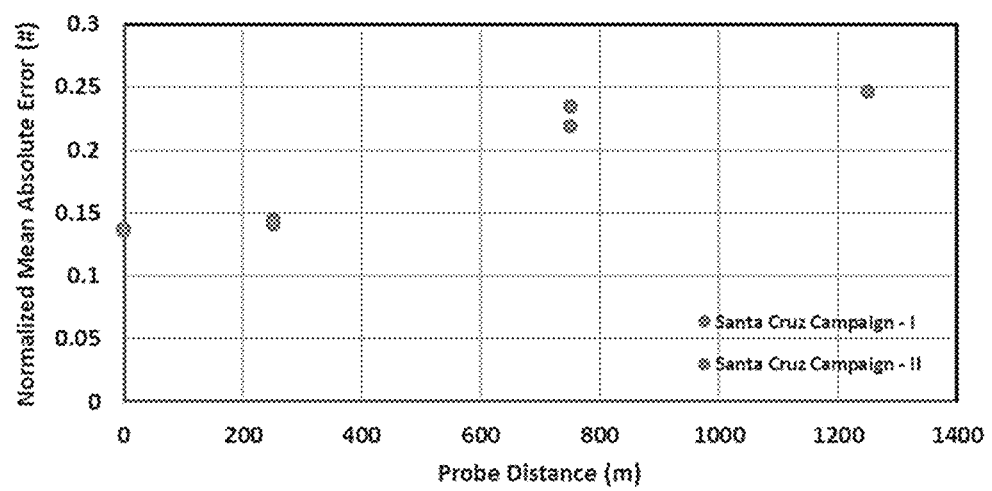
FIG. 13 is a comparison with probe distance for both the campaigns.

2nd campaign—FIG. 11 shows the comparison of normalized mean absolute error with probe distance for different time record lengths for a full-length propagation. Sensitivity analysis for the real-time prediction by varying the sliding window lengths and the sliding window offsets is shown in FIG. 12 and finally, the error comparison with probe distance for both the campaigns is shown in FIG. 13.

Figure 14:
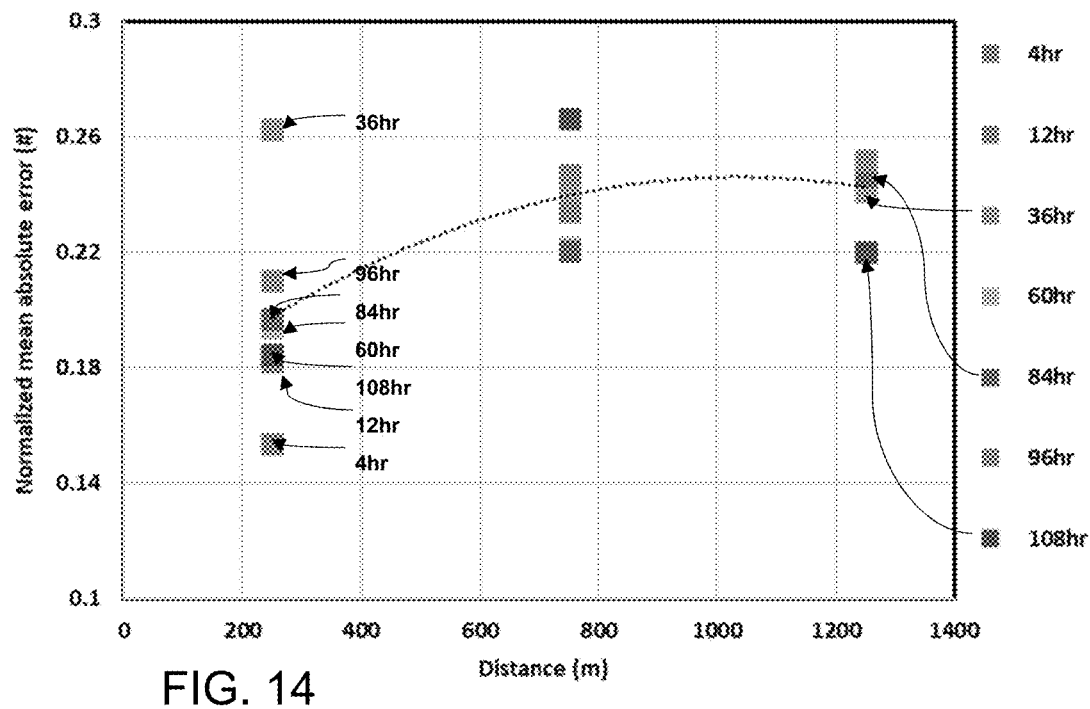
FIG. 14 is a comparison of mean absolute error and spacing between probes.

Sensitivity analysis was also conducted to study the error estimation with the spacing of the probes (distance). Error as a function of distance between probes for different time slots are shown in FIG. 14. Trends from the sensitivity analysis show that the error increases with the increasing distance between the probes.

Example 3: Enhancing Accuracy with RTK

The primary purpose of this exercise was to estimate the measurement accuracy of the purpose-built GPS buoys. Since these buoys rely only on GPS data to estimate their x, y, z position as a function of time, testing was done to evaluate the contribution of measurement accuracy to the overall wave prediction errors identified. As a secondary effort, an Inertial Measurement Unit (IMU) measurement package that is typically used in drone autopilots—a PIXHAWK® 4 running a PX4 operating system, was incorporated. In-ocean validation was performed using a survey-grade RTK system that allows instantaneous streaming of position at a 1 Hz sampling rate with an error of less than 25 mm (1 inch). Given wave amplitudes on the order of 1 m, this allowed accurate benchmarking of the buoy motion in a relevant environment. This exercise involved evaluation of the IMU and buoy to RTK comparison. Overall, the work showed that accurate wave measurement is important to enable accurate wave prediction.

An Inertial Measurement Unit (IMU) is an electronic device that measures and reports a body's specific force, angular rate, and magnetic field surrounding the body. In order to track and measure the translational and rotational movements of a body in three dimensions, tri-axis sensors consisting of three mutually orthogonal axes are required. The sensor fusion approach that is often used for this purpose includes: (1) a 3-axis accelerometer that measures acceleration; (2) a 3-axis gyroscope that measures angular velocity; and (3) a 3-axis magnetometer that measures magnetic field intensity. A smart fusion between these nine parameters (referred to as "sensor fusion") results in the estimation of the local and global position of the body. The results showed that linear motion can be measured relatively accurately. However, as the IMU rotates, it is necessary to compensate for the linear accelerations that are purely due to gravitational pull using the gyroscope data. It is well known that the output from the sensors of an IMU are subject to high levels of noise; for example, accelerations due to the motion can corrupt the measured direction of gravity. To resolve this issue, an orientation filter may be used to compute a single estimate of orientation through the optimal fusion of gyroscope, accelerometer and magnetometer measurements. One of the most widely accepted bases for orientation filter is the Kalman filter algorithm (Kalman, 1960). A number of commercial inertial orientation sensors based on Kalman filters are available. Other appropriate filters employ a quaternion representation of orientation.

An IMU/GPS assembly was tested for position estimation first with linear motion, then with rotational motion, to simulate wave conditions. The rotational motion was created by attaching the assembly to a rotary arm driven by an electric motor with a sinusoidal input in the z direction, and with the assembly connected to strings to allow free, random rotation. Linear motion tests showed that motion can be reproduced relatively accurately using the integrated acceleration values obtained from the IMU.

For a comparison of the IMU to the GPS-buoy, an outdoor test-stand was set up to allow movement of the buoy/IMU assembly through a pre-described motion profile under an open sky, which was important for the GPS to work. Primarily, the tests were conducted in a parking lot in an open environment without any interference from surrounding trees or any other obstruction. The motor drive was placed on an adjustable platform ladder that provided leverage to conduct circular motion without having to worry about the device touching the ground. Results of test stand measurements showed that given small rotational motion of the GPS-Buoy itself, acceleration values can be used relatively accurately. However, the GPS-Buoy did not resolve the position very well.

Figure 15:
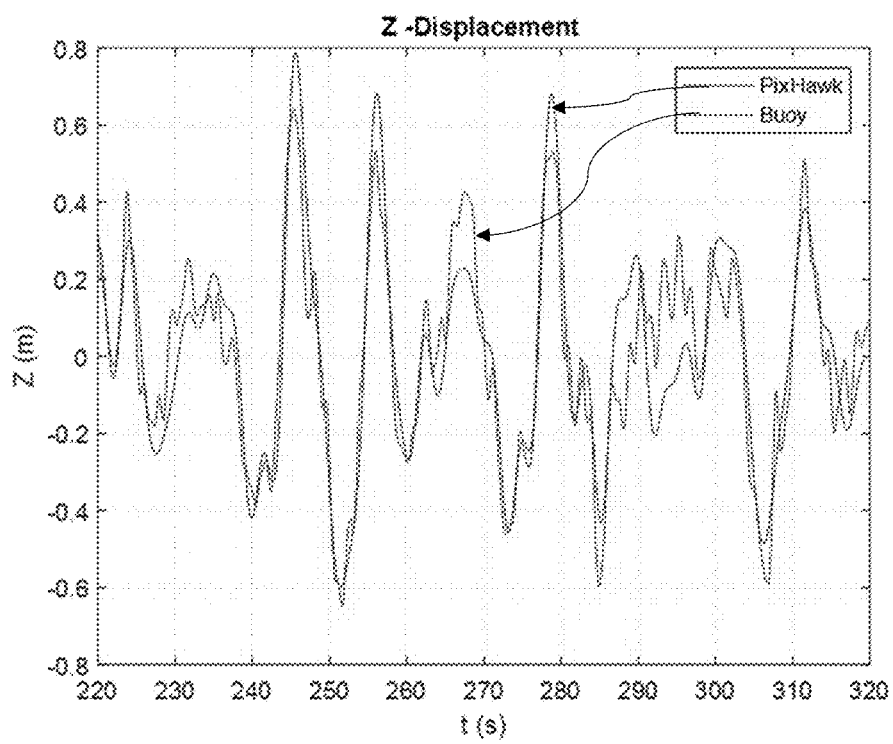
FIG. 15 is a plot of water free-surface elevation (z displacement) as measured by the IMU and the GPS-buoy.

An experimental campaign was next conducted to test the position estimation accuracy of the IMU device in the real ocean environment and compare it to the GPS-Buoy. A PixiHawk Mini autopilot along with the 3DR GPS was put in a waterproof box for the ocean tests. The GPS-Buoy was also deployed with the Pixhawk IMU to provide a validation for the measurement. The waterproof container was strapped to the GPS-Buoy and data were collected for approximately 30 minutes. FIG. 15 shows the comparative results of the position data (for a time window of 220 s-320 s) obtained from the IMU (after post-processing), highlighting some of the challenges encountered in the accurate estimation of the position data. In the second part of this exercise, RTK was employed. Real-Time Kinematics (RTK) is a differential Global Navigation Satellite System (GNSS) technique that provides position updates in the vicinity of a base station. The RTK system, comprising a rover and base station, provides centimeter-level accuracy in measurements. This technique is commonly used in land surveying applications and involves transmission of correction signals from the base station to the rover to cancel out the errors that drive the stand-alone position signal of the rover module. Typically, an RTK base station covers a service area spreading about 10 or 20 kilometers, and a real-time communication channel is needed between the base and rover.

Wave measurement campaigns with RTK were conducted in two stages. The first tests were carried out in shallow waters near a pier. The second stage was conducted with a boat in deep water (50 m). For both the tests, measurements from the buoy were validated against measurements from a commercial RTK system which was assumed to be the reference "truth model". Error analysis was done to compute the mean absolute error between RTK and a GPS-Buoy measurement. The absolute error for the commercial RTK system was estimated by the system itself and is on the order of 1-3 cm in horizontal and vertical direction. The RTK sample rate was set at 1 s.

Figure 16:
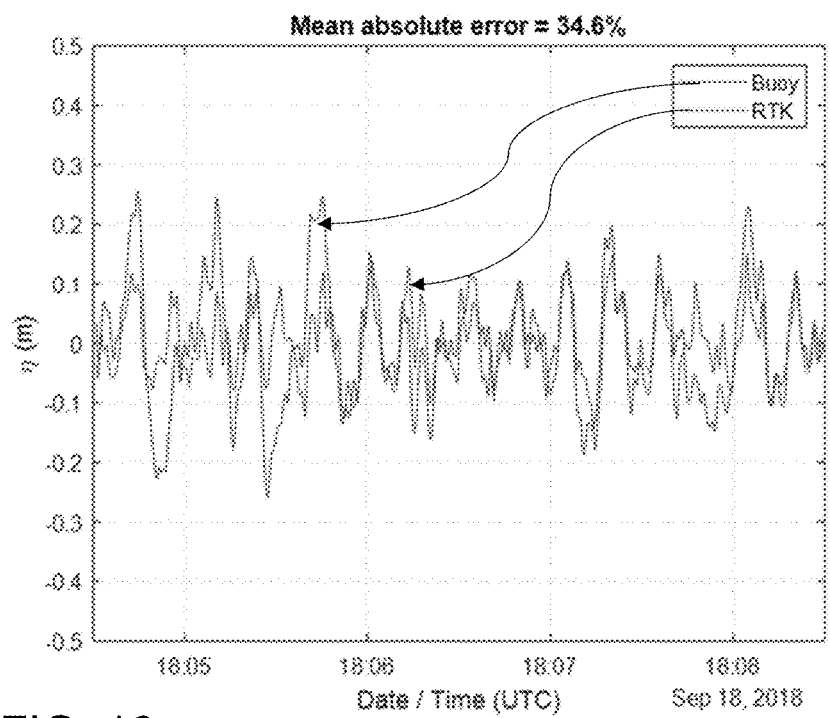
FIG. 16 is a water surface elevation comparison between GPS-Buoy and RTK for shallow water testing.

In the first stage of RTK testing, the measurements from the buoy were validated against those obtained from commercial survey-grade RTK. The mean absolute error between RTK and a GPS-Buoy measurement was computed. FIG. 16 provides an example of the results of the comparative surface elevation time histories from the buoy and the RTK measurements for the shallow water tests.

Figure 17:
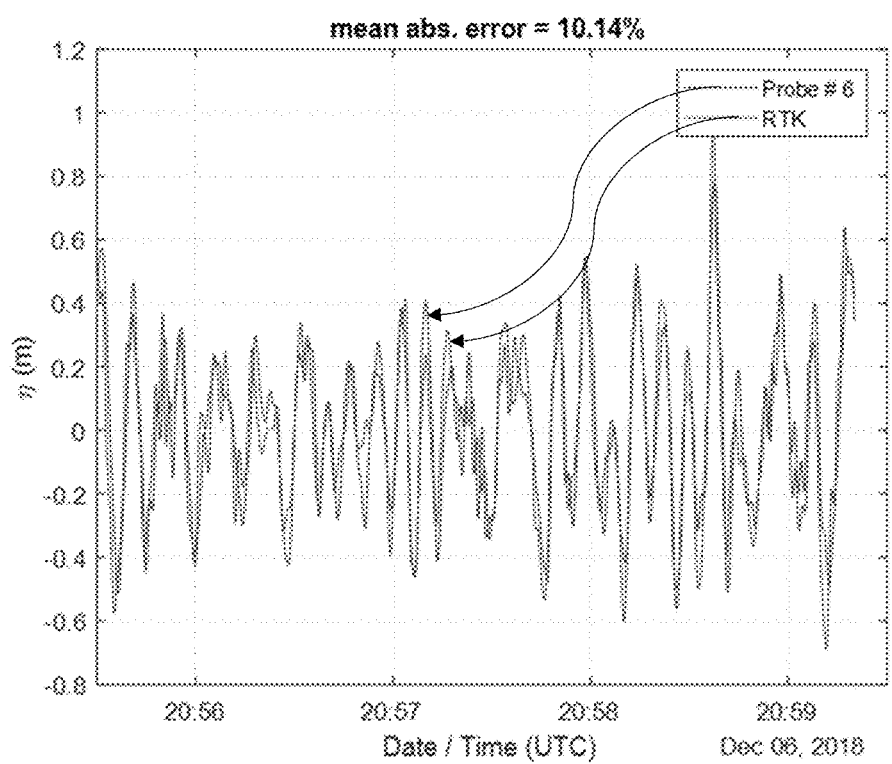
FIG. 17 is a water surface elevation comparison between GPS-Buoy and RTK for deep water testing.

The second stage of experimental measurements involved testing the RTK module with the GPS-Buoy in deep water conditions. Collocated measurements were taken using a GPS-Buoy and a commercial RTK system. The RTK rover was placed on a surfboard and connected to the GPS-Buoy. The base station for the RTK was set up on shore with direct line of site to the measurement site. FIG. 17 is an example of the comparative surface elevation time histories from the GPS-Buoy and the RTK measurements for the deep-water tests.

Given these results, implementation of a sensor ensemble approach can be seen to significantly improve the wave measurement accuracy and robustness.

The embodiments presented in the foregoing description provide an important advancement in the ability to measure and predict waves. A key aspect of the improvement is derived through the use of the three-dimensional motion measurement of a wave measurement system to fully identify and predict the waves. This allows for the identification of the wave component direction from a single buoy, which represents a significant improvement of prior art where at least three surface elevation measurements were required to identify the wave propagation direction through a numerical triangulation approach. This means that fewer measurement probes are required to fully identify a directional wave train in the open ocean, making the system simpler and more economical. While directional wave measurement buoys have been in existence for some time, this information has not been used to enable phase-resolved wave forecasts, possibly because these measurements have heretofore been believed to be not accurate enough to enable an accurate-enough identification of wave components.

Further innovations incorporated in the inventive approach relate to the use of methods and communications that make this system real-time capable and allow it to continuously provide updated wave-forecasts. These improvements include a sliding window approach and transmitting the data in real-time to a central processor to synchronize data from multiple measurement buoys and feed into the wave prediction system.

The ability to predict wave characteristics has many uses, the foremost of which is as a safety assessment of maritime works and activities, geared toward the preservation of life and property. For ship-motion prediction, many offshore operational activities such as transfer of personnel from one ship to another, the landing of a helicopter on a ship deck, fuel and cargo transfer, ship-docking, etc., require the platform and ship to be relatively stable. Being able to predict ship motions allows operations to be carried out more safely. The wave-prediction can also be used to optimize the ship's orientation and speed to traverse large waves safely. Typically, wave radar is used to measure wave-fields in this application area. In general, a system employing the inventive wave prediction scheme may include an output device such as a display for visual notification of wave conditions, or a speaker or other audible output communication. The computer processor that processes the data to generate the prediction may include programming to compare the predicted wave characteristics to one or more predetermined thresholds that correspond to a hazard condition, such as excessive wave height or velocity. The threshold for a hazard can be user-determined, depending on the activity that may be occurring, e.g., cargo loading, personnel transfer, athletic competitions, or other activities. When the threshold is exceeded, the output device would generate a signal, such as an audible alarm, a flashing light, or may simply display on a display device that is being monitored.

In additional to operational safety enhancements, the inventive method and system enable optimal control of ocean wave energy conversion (WEC) devices via feed-forward control methods (typically model predictive control). These control methods require a forecast of the wave-excitation forces acting on the structure to be truly optimal, which can be computed from a future estimate of a phase-resolved wave-field. In such applications, the prediction results will be communicated to the WEC control system to guide adjustments for optimal efficiency. Additional applications include prediction of extreme wave impacts to enable a wide range of marine operations, and minimization of resonance modes and platform motions for floating deep-water offshore wind turbines prediction to facilitate automated control to minimize motion, safe passage through rough seas, or reduced fuel consumption.

Additional features and variations of the method and system will be readily apparent to those of skill in the art based upon the descriptions and examples provided herein. Different combinations of individual elements and steps may also be made to achieve the goal of providing accurate, real-time wave prediction capabilities.

REFERENCES (INCORPORATED HEREIN BY REFERENCE)

[1] I. Prislin and J. Zhang, "Deterministic decomposition of deep water short-crested irregular gravity waves," Journal of Geophysical Research, vol. 102, no. C6, pp. 12677-12688, 1997.

[2] J. Zhang, J. Yang, J. Wen, I. Prislin and K. Hong, "Deterministic wave model for short-crested ocean waves: Part I. Theory and numerical scheme," Applied Ocean Research, vol. 21, pp. 167-188, 1999.

[3] J. Zhang, I. Prislin, J. Yang and J. Wen, "Deterministic wave model for short-crested ocean waves: Part II. Comparison with laboratory and field measurements," Applied Ocean Research, vol. 21, pp. 189-206, 1999.

[4] E. Meza, J. Zhang and R. J. Seymour, "Prediction of surface wave elevation based on pressure measurements," Transactions of the ASME, vol. 121, pp. 242-250, 1999.

[5] D. Edgar, J. Horwood, R. Thurley and M. Belmont, "The effects of parameters on the maximum prediction time possible in short term forecasting of the sea surface shapeq," International Shipbuiding Progress, vol. 47, no. 451, pp. 287-301, 2000.
[6] M. Belmont, J. Baker and J. Harwood, "Avoidance of phase shift errors in short term deterministic sea wave prediction," Journal of Marine Engineering and Technology, vol. 2, no. 2, pp. 21-26, 2003.
[7] M. Belmont, J. Horwood, R. Thurley and J. Baker, "Filters for linear sea-wave prediction," Ocean Engineering, vol. 33, pp. 2332-2351, 2006.
[8] E. Blondel, F. Bonnefoy and P. Ferrant, "Deterministic non-linear wave prediction using probe data," Ocean Engineering, vol. 37, pp. 913-926, 2010.
[9] J. Halliday, D. Dorrell and A. Wood, "An application of the fast fourier transform to the short-term prediction of sea wave behaviour," Renewable Energy, vol. 36, pp. 1685-1692, 2011.
[10] L. Abusedra and M. Belmont, "Prediction diagrams for deterministic sea wave prediction and the introduction of the data extension prediction method," International Ship Building Progress, vol. 58, pp. 59-81, 2011.
[11] P. Naaijen and E. Couprie, "Reconstruction and prediction of short-crested seas based on the application of a 3D-FFT on synthetic waves. Part 1: Reconstruction," in International conference on Ocean, Offshore and Arctic Engineering (OMAE), Rio de Janeiro, Brazil, 2012.
[12] E. Couprie and P. Naaijen, "Reconstruction and prediction of short-crested seas based on the application of a 3D-FFT on synthetic waves. Part 2: Prediction," in International Conference on Ocean, Offshore and Arctic Engineering (OMAE), Rio de Janeiro, Brazil, 2012.
[13] E. Blondel-Couprie, F. Bonnefoy and P. Ferrant, "Experimental validation of non-linear deterministic prediction schemes for long-crested waves," Ocean Engineering, vol. 58, pp. 284-292, 2012.
[14] A. Simanesew, Deterministic prediction of sea waves-Long crested sea, Oslo, Norway: University of Oslo, 2013.
[15] P. Naaijen, K. Trulsen and E. Blondel-Couprie, "Limits to the extent of the spatio-temporal domain for deterministic wave prediction," International Shipbuilding Progress, vol. 61, pp. 203-223, 2014.
[16] M. Belmont, J. Christmas, J. Dannenberg, T. Hilmer, J. Duncan, J. Duncan and B. Ferrier, "An examination of the feasibility of linear deterministic sea wave prediction in multidirectional seas using wave profiling radar: Theory, Simulation and Sea Trials," Journal of atmospheric and oceanic technology, vol. 31, pp. 1601-1614, 2014.
[17] U. Korde, "Near-optimal control of a wave energy device in irregular waves with deterministic-model driven incident wave prediction," Applied ocean research, vol. 53, pp. 31-45, 2015.
[18] A. Bradley, Real-time estimation and prediction of wave excitation force for wave energy control applications, Corvallis, Oregon: Ph.D. thesis, Oregon State University, 2015.
[19] S. Yoon and J. Kim, "An explicit data assimilation scheme for a nonlinear wave prediction model based on a psuedo-spectral method," IEEE Journal of Oceanic Engineering, vol. 41, no. 1, pp. 112-122, 2016.
[20] D. Cavaglieri, New numerical methods for computational fluid dynamic, forecast and control, Ph.D. dissertation, San Diego: University of California, San Diego, 2016.
[21] Y. Pena-Sanchez and J. Ringwood, "A critical comparison of AR and ARMA models for short-term wave forecasting," in 12th European Wave and Tidal Energy Conference, Cork, Ireland, 2017.
[22] N. Kollisch, J. Behrendt, M. Klien and N. Hoffmann, "Nonlinear real time prediction of ocean surface waves," Ocean Engineering, vol. 157, pp. 387-400, 2018.
[23] A. Merigaud and J. Ringwood, "Incorporating ocean wave spectrum information in short-term free-surface elevation forecasting," IEEE Journal of Oceanic Engineering, vol. 44, no. 2, pp. 401-414, 2019.
[24] M. Klein, M. Dudek, G. Clauss, S. Ehlers, J. Behrendt, N. Hoffman and M. Onorato, "On the deterministic prediction of water waves," Fluids, vol. 5, no. 1, pp. 1-19, 2020.
[25] E. Blondel, G. Ducrozet, F. Bonnefoy and P. Ferrant, "Deterministic reconstruction and prediction of a non-linear wave field using probe data," in International Conference on Offshore Mechanics and Artic Engineering OMAE, Estoril, Portugal, 2008.
[26] P. Naaijen and R. Huijsmans, "Real time wave forecasting for real time ship motion predictions," in International Conference on Offshore Mechanics and Arctic Engineering OMAE, Estoril Portugal, 2008.
[27] J. R. Halliday, D. Dorrell and A. Wood, "The application of short-term deterministic wave prediction to offshore electricity generation," Renewable Energy and Power Quality, vol. 1, no. 3, pp. 260-267, 2005.
[28] G. Wu, Direct simulation and deterministic prediction of large-scale nonlinear ocean wave-field, Massachusetts: Massachusetts Institute of Technology MIT, 2004.
[29] Y. Yang and S. Kwon, "Prediction of irregular ocean wave and floating body motion by regularization: Part 1. Irregular wave prediction," Transactions of FAMENA, vol. 40, no. 4, pp. 41-54, 2016.
[30] Y. Yang and S. Kwon, "Predictions for irregular ocean wave and floating body motion by regularization: Part 2. Motion prediction," Transactions of FAMENA, vol. 41, no. 1, pp. 37-53, 2017.
[31] S. Kosleck, Prediction of wave-structure interaction by advanced wave field forecast, Auckland, New Zealand: Maritime engineering, Faculty of design and creative technologies, Auckland University of Technology, 2013.
[32] E. Blondel-Couprie and P. Naaijen, "Reconstruction and prediction of short-crested seas based on the application of a 3D-FFT on synthetic waves. Part 2: Prediction," in International Conference on Ocean, Offshore and Arctic Engineering (OMAE), Rio de Janeiro, Brazil, 2012.
[33] K. Takagi, S. Hamamichi, R. Wada and Y. Sakurai, "Prediction of wave time-history using multipoint measurements," Ocean Engineering, vol. 140, pp. 412-418, 2017.
[34] A. Simanesew, K. Trulsen, H. Krogstad and J. Borge, "Surface wave predictions in weakly nonlinear directional seas," Applied Ocean Research, vol. 65, pp. 79-89, 2017.
[35] Y. Qi, G. Wu, Y. Liu and D. Yue, "Predictable zone for phase-resolved reconstruction and forecast of irregular waves," Wave Motion, vol. 77, pp. 195-213, 2018.
[36] W. Xiao, L. Henry, Y. Liu, K. Hendrickson and D. Yue, "Ocean wave prediction using large-scale phase-resolved computations," in DoD High Performance Computing Modernization Program (HPCMP) Users Group, Seattle, WA, USA, 2008.
[37] S. Tanaka, S. Hamamichi, R. Wada, K. Takagi and J. Imamura, "Wave motion alert system by multiple drones," in Oceans MTS/IEEE, Charleston, South Carolina, USA, 2018.

[38] G. Clauss, S. Kosleck, D. Testa and R. Stuck, "Forecast of critical wave groups from surface elevation snapshots," in International Conference on Offshore Mechanics and Arctic Engineering (OMAE), June 10-15, San Diego, USA, 2007.

[39] G. Clauss, M. Klein, M. Dudek and M. Onorato, "Application of higher order spectral method for deterministic wave forecast," in International Conference on Ocean, Offshore and Arctic Engineering, June 8-13, San Francisco, CA, USA, 2014.

The invention claimed is:

1. A method for predicting wave properties at one or more target location within a body of water, the method comprising:
    deploying a plurality of wave measurement devices within the body of water at one or more deployment location at a distance from the one or more target location, each wave measurement device configured to measure device motion and transmit signals comprising a data stream including location coordinates as a function of time;
    receiving the data streams from the plurality of wave measurement devices within a computing system configured to iteratively execute the steps of:
        applying a sensor fusion algorithm to data streams received from the plurality of wave measurement devices;
        generating from the data streams time-series data comprising x, y, and z parameters of the plurality of wave measurement devices in time relative to a fixed reference in space;
        identifying within the time-series data parameters to establish boundary conditions of a numerical model;
        computing using the numerical model a predicted wave field comprising time-series data for wave properties comprising one or more of wave elevation, wave direction, wave velocity, wave spectral components as a function of frequency, wave amplitude as a function of direction, and wave-excitation forces; and
        providing the predicted wave field to one or more of an end user, a storage medium, and a control system.

2. The method of claim 1, wherein the computing system is further configured to execute a learning machine, wherein the learning machine is trained to implement one or more of the steps of applying, generating, identifying, and computing.

3. The method of claim 1, further comprising, before or after providing, updating the boundary conditions as new time-series data is generated.

4. The method of claim 1, wherein the plurality of wave measurement devices is selected from the group consisting of a buoy, a platform, a float, a boat, a ship, a submerged vehicle, an autonomous vehicle, and an instrument suspended from or mounted on a buoy, a platform, a float, a boat, a ship, a submerged vehicle, or an autonomous vehicle.

5. The method of claim 4, wherein one or more of the plurality of wave measurement devices is a dynamically positioned autonomous vehicle.

6. The method of claim 1, wherein the computing system is further configured to correct for drift of one or more of the plurality of wave measurement devices from the x and y positions using location data.

7. The method of claim 1, wherein the data streams further comprise water velocity measured at one or more of the plurality of wave measurement devices, and wherein the computing system is further configured to correct for device velocity or water current.

8. The method of claim 1, wherein the data streams further comprise one or a combination of GPS data, real-time kinematic (RTK) positioning data, and Inertial Measurement Unit (IMU) data.

9. The method of claim 8, wherein the data streams further comprise corrective location data.

10. A system for predicting wave properties at one or more target locations within a body of water, comprising:
    a plurality of wave measurement devices configured to be located within the body of water at one or more deployment location at a distance from the one or more target location, each wave measurement device further configured to measure device motion and transmit signals comprising a data stream of time-series data comprising location coordinates as a function of time; and
    a computing system in communication with the plurality of wave measurement devices for receiving multiple data streams and iteratively processing the time-series data to:
        apply a sensor fusion algorithm to the data streams received from the plurality of wave measurement devices;
        generate from the data streams time series data comprising x, y, and z coordinates of the plurality of wave measurement devices in time relative to a fixed reference in space;
        identify within the time-series data parameters to establish boundary conditions of a numerical model;
        compute, using the numerical model, a predicted wave field comprising time-series data for wave properties comprising one or more of wave elevation, wave direction, wave velocity, wave spectral components as a function of frequency, wave amplitude as a function of direction, and wave-excitation forces; and
        provide the predicted wave field to one or more of an end user, a storage medium, and a control system.

11. The system of claim 10, wherein the computing system is further configured to execute a learning machine, wherein the learning machine is trained to implement one or more of the steps of applying, generating, identifying, and computing.

12. The system of claim 10, wherein the computing system is further configured to, before or after providing, update the boundary conditions as new time-series data is generated.

13. The system of claim 10, wherein the plurality of wave measurement devices is selected from the group consisting of a buoy, a platform, a float, a boat, a ship, a submerged vehicle, an autonomous vehicle, and an instrument suspended from or mounted on a buoy, a platform, a float, a boat, a ship, a submerged vehicle or an autonomous vehicle.

14. The system of claim 10, wherein one or more of the plurality of wave measurement devices is a dynamically positioned autonomous vehicle.

15. The system of claim 10, wherein the computing system is further configured to correct for drift of one or more of the plurality of wave measurement devices from the x and y positions using location data.

16. The system of claim 10, wherein the data streams further comprise water velocity measured at one or more of the plurality of wave measurement devices, and wherein the computing system is further configured to correct for device velocity or water current.

17. The system of claim 10, wherein the data streams further comprise one or a combination of GPS data, real-time kinematic (RTK) positioning data, and Inertial Measurement Unit (IMU) data.

18. The system of claim 17, wherein the data streams further comprise corrective location data.

19. The method of claim 1, wherein the computing step further comprises:
 implementing a correction loop comprising:
  comparing past wave-predictions to past measurements taken at the one or more target location to determine whether a prediction error occurred; and
  if a prediction error is identified, incorporating an iterative error minimization routine into the computing step.

20. The system of claim 10, wherein the computing system is further configured to implement a correction loop by:
 comparing past wave-predictions to past measurements taken at the one or more target location to determine whether a prediction error occurred; and
 if a prediction error is identified, incorporating an iterative error minimization routine into the computing step.

21. A method for predicting wave properties at one or more target location within a body of water, the method comprising:
 deploying a plurality of wave measurement devices within the body of water at one or more deployment location at a distance from the one or more target location, each wave measurement device configured to measure device motion and transmit signals comprising a data stream including one or more of surface displacements, motion response, subsea pressure, acceleration, angular velocity, and magnetic field intensity as a function of time;
 receiving the data streams from the plurality of wave measurement devices within a computing system configured to iteratively execute the steps of:
 applying a sensor fusion algorithm to the data streams;
 generating from the data streams wave data comprising one or a combination of translational motion parameters and rotational motion parameters of one wave measurement device in time relative to a fixed reference in space;
 identifying within the wave data to establish boundary conditions of a numerical model;
 computing using the numerical model a predicted wave field comprising wave data for wave properties comprising one or more of wave elevation, wave direction, wave velocity, wave spectral components as a function of frequency, wave amplitude as a function of direction, and excitation forces; and
 providing the predicted wave field to one or more of an end user, a storage medium, and a control system.

22. The method of claim 21, wherein the computing system is further configured to execute a learning machine, wherein the learning machine is trained to implement one or more of the steps of applying, generating, identifying, and computing.

23. The method of claim 21, wherein the computing step further comprises:
 implementing a correction loop comprising:
  comparing past wave-predictions to past measurements taken at the one or more target location to determine whether a prediction error occurred; and
  if a prediction error is identified, incorporating an iterative error minimization routine into the computing step.

24. The method of claim 21, wherein the data stream comprises one or a combination of GPS data, real-time kinematic (RTK) positioning data, and Inertial Measurement Unit (IMU) data.

\* \* \* \* \*